(12) United States Patent
Kimura et al.

(10) Patent No.: US 9,946,419 B2
(45) Date of Patent: Apr. 17, 2018

(54) DISPLAY DEVICE SUBSTRATE AND DISPLAY DEVICE

(71) Applicant: TOPPAN PRINTING CO., LTD., Taito-ku (JP)

(72) Inventors: Yukihiro Kimura, Taito-ku (JP); Kenzo Fukuyoshi, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 166 days.

(21) Appl. No.: 14/974,301

(22) Filed: Dec. 18, 2015

(65) Prior Publication Data

US 2016/0103531 A1   Apr. 14, 2016

Related U.S. Application Data

(63) Continuation of application No. PCT/JP2013/078760, filed on Oct. 24, 2013.

(30) Foreign Application Priority Data

Jun. 19, 2013   (JP) ................. 2013-128310

(51) Int. Cl.
*G06F 3/044* (2006.01)
*G02F 1/1333* (2006.01)
(Continued)

(52) U.S. Cl.
CPC .......... *G06F 3/044* (2013.01); *G02F 1/13338* (2013.01); *G06F 3/0412* (2013.01); *H01L 27/323* (2013.01); *G06F 2203/04103* (2013.01)

(58) Field of Classification Search
None
See application file for complete search history.

(56) References Cited

U.S. PATENT DOCUMENTS

| 5,550,659 A | 8/1996 | Fujieda et al. |
| 2008/0062147 A1 | 3/2008 | Hotelling et al. |

(Continued)

FOREIGN PATENT DOCUMENTS

| JP | 2653014 B2 | 9/1997 |
| JP | 2009-199093 A | 9/2009 |

(Continued)

OTHER PUBLICATIONS

International Search Report dated Jan. 28, 2014 in PCT/JP2013/078760, filed Oct. 24, 2013.

*Primary Examiner* — Kenneth B Lee, Jr.
(74) *Attorney, Agent, or Firm* — Oblon, McClelland, Maier & Neustadt, L.L.P.

(57) ABSTRACT

A display device substrate including a transparent substrate having a display portion formed in an overall rectangular shape in a planar view, an electrode disposed in the display portion and having pixel openings, the electrode including partial patterns which are electrically isolated from one another and formed in parallel to a first direction along the transparent substrate, a first transparent resin layer formed on the electrode, a transparent electrode formed on the first transparent resin layer, and including partial patterns which are formed along the transparent substrate and in parallel to a second direction perpendicular to the first direction, and a second transparent resin layer formed on the partial patterns of the transparent electrode.

20 Claims, 18 Drawing Sheets

(51) Int. Cl.
*G06F 3/041* (2006.01)
*H01L 27/32* (2006.01)

(56) References Cited

U.S. PATENT DOCUMENTS

| | | |
|---|---|---|
| 2012/0105337 A1 | 5/2012 | Jun et al. |
| 2013/0076996 A1* | 3/2013 | Misaki ................. G06F 3/0418 349/12 |
| 2014/0160377 A1* | 6/2014 | Yamagishi .............. G06F 3/044 349/12 |

FOREIGN PATENT DOCUMENTS

| | | |
|---|---|---|
| JP | 2010-160745 A | 7/2010 |
| JP | 2012-098687 A | 5/2012 |
| WO | WO 2013/018495 A1 | 2/2013 |

* cited by examiner

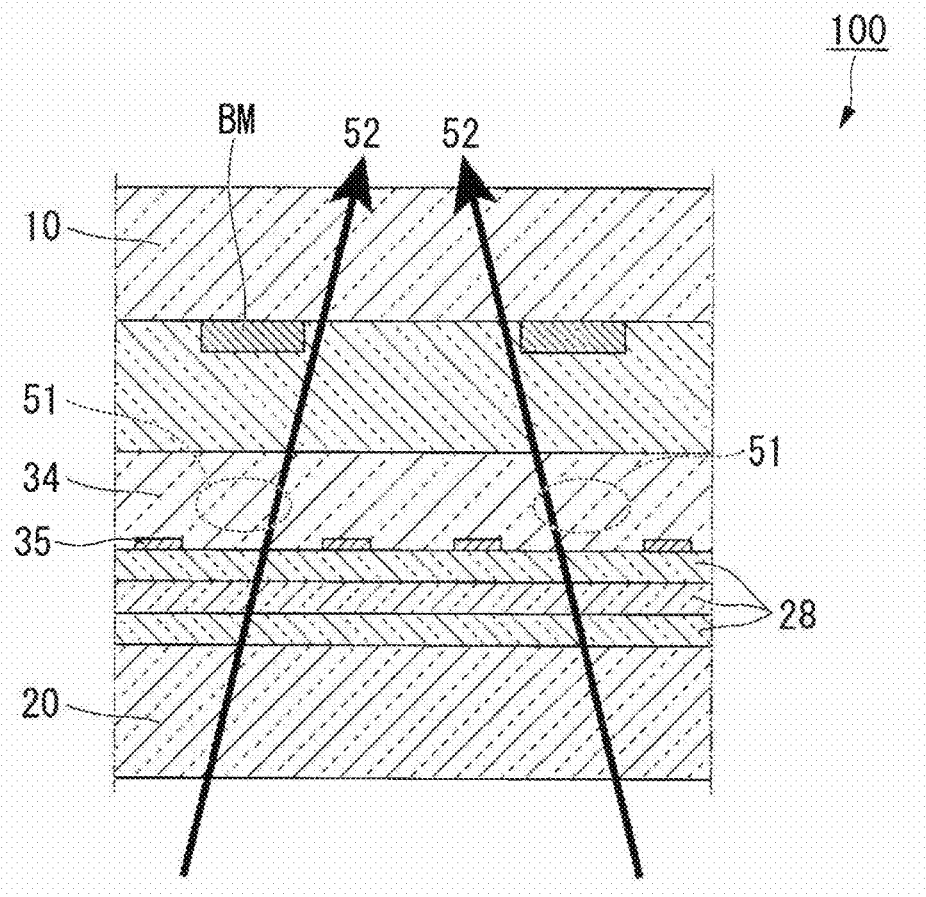

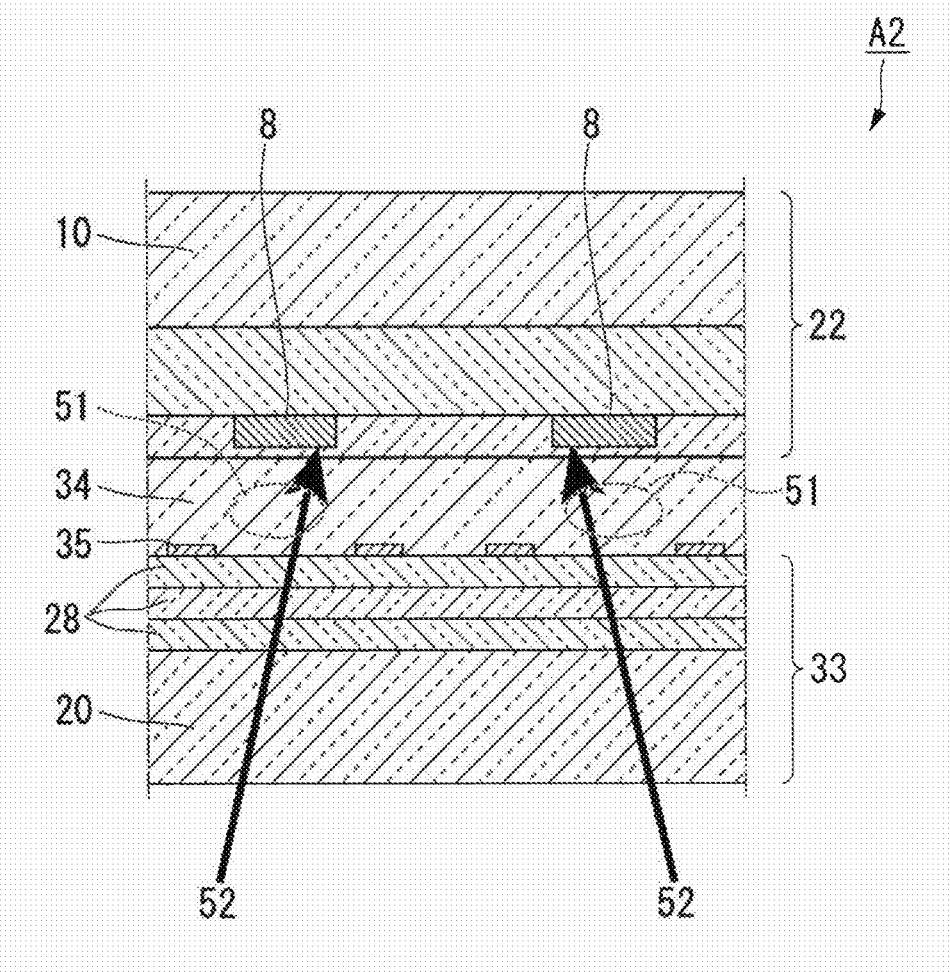

DISPLAY DEVICE SUBSTRATE AND DISPLAY DEVICE

CROSS-REFERENCE TO RELATED APPLICATIONS

The present application is a continuation of International Application No. PCT/JP2013/078760, filed Oct. 24, 2013, which is based upon and claims the benefits of priority to Japanese Application No. JP 2013-128310, filed Jun. 19, 2013. The entire contents of these applications are incorporated herein by reference.

BACKGROUND OF THE INVENTION

Field of the Invention

The present invention relates to a display device substrate capable of being applied with, for example, a touch sensing function or the like and a display device provided with a display device substrate. Further, the present invention is able to provide a display device substrate including a low reflectance electrode having low reflectance properties suitable for the display device and excellent light shielding properties for the transmitted light.

Discussion of the Background

Recently, in order to accomplish bright display and low power consumption, a high aperture ratio is required in a liquid crystal display device or an organic EL display device. According to these display devices, usually, a black matrix is used to divide pixels, improving the display contrast.

(Light Shielding Properties of Black Matrix)

A black matrix is arranged to surround pixels in order to secure the display contrast. Usually, to obtain light shielding properties, the black matrix is formed on a transparent substrate such as glass with a black resin where a colorant such as carbon is dispersed into a resin to have a film thickness of 1 μm. In particular, a frame portion provided on four sides in a periphery of the display portion where the plurality of pixels are arranged in matrix, that is, a black matrix formed in a frame shape, is required to have high light shielding properties such as an optical density of 5 or more or, or 6 or more, in the transmittance measurement. Light leakage of the backlight unit is likely to occur from the frame portion. Hence, the frame portion is required to have higher optical density than the black matrix formed on the display portion.

In addition to the high light shielding properties, the black matrix is required to have low reflectance to obtain high image quality or to improve its design. However, according to the black resin where a colorant such as carbon is dispersed into a resin, the more the content of carbon is increased, the higher the reflectance. Therefore, it has been hard to achieve high light shielding properties (high optical density) and low reflectance, and a black matrix having low film thickness.

(Thinning of Black Matrix)

In display devices of portable mobile equipment such as cellular phones, a thin black matrix is required due to a high-definition requirement e.g., 200 ppi or more and further 300 ppi or more. To obtain the black matrix with a high-definition quality, the pixel width becomes narrower, typically 30 μm or less. Accordingly, it has revealed that planarity of the color filters deteriorated due to the film thickness of the black matrix. The black matrix of a high-definition display device having a density of 300 ppi or more requires a thin pattern having a thickness of 4 μm or less.

For example, to enhance the light shielding properties of the black matrix, a black matrix having a thin pattern having a thickness of 4 μm or less is formed by a process where a photolithography step is performed for two times. Specifically, forming a black matrix having two layers is extremely difficult from the perspective of alignment. The formation of the black matrix with two step processes is likely to cause a change in width of lines and display unevenness due to an alignment error.

(Touch Sensing Function of Display Device)

As a method of directly inputting to a liquid crystal display device or an organic EL display device, there are methods in which an electrostatic capacitive type touch panel is attached to these display devices, and methods in which elements corresponding to the touch sensing function are provided in the display device. The latter is referred to as in-cell type method. The in-cell type method includes methods using an electrostatic capacitive type or an optical sensor.

According to the in-cell type touch sensing technique in which the display device itself allows inputs from a pointer such as fingers, electrostatic capacitive type is often used. In this electrostatic capacitive type method, two pairs of the plurality of electrode groups to detect electrostatic capacitance are required to detect electrostatic capacitance as disclosed in patent literatures 1 to 4.

PATENT LITERATURE

PTL 1: Japanese Patent No. 2653014
PTL 2: Japanese Patent Application Laid-Open Publication No. 2010-160745
PTL 3: International Publication No. 2013/018495
PTL 4: Japanese Patent Application Laid-Open Publication No. 2012-98687

SUMMARY OF THE INVENTION

According to one aspect of the present invention, a display device substrate includes a transparent substrate having a display portion formed in an overall rectangular shape in a planar view, an electrode disposed in the display portion and having pixel openings, the electrode including partial patterns which are electrically isolated from one another and formed in parallel to a first direction along the transparent substrate, a first transparent resin layer formed on the electrode, a transparent electrode formed on the first transparent resin layer, and including partial patterns which are formed along the transparent substrate and in parallel to a second direction perpendicular to the first direction, and a second transparent resin layer formed on the partial patterns of the transparent electrode.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 20 is a cross sectional view showing an effect of a display device according to the fourth embodiment of the present invention.

FIG. 21 is a cross sectional view showing an effect of a display device according to the fourth embodiment of the present invention.

DESCRIPTION OF THE EMBODIMENTS

Figure 1:
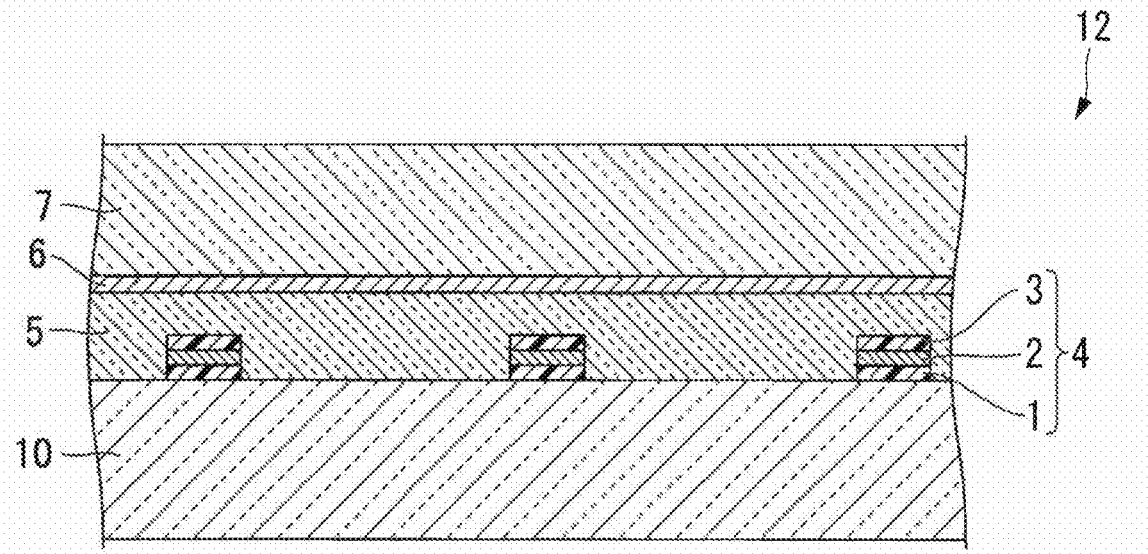
FIG. 1 is a cross sectional view showing a display device substrate according to the first embodiment of the present invention.

The embodiments will now be described with reference to the accompanying drawings, wherein like reference numerals designate corresponding or identical elements throughout the various drawings.

With reference to the drawings, hereinafter will be described embodiments of the present invention. In the following explanation, regarding functions and elements which are identical or substantially identical, the same reference numbers are applied and the explanation thereof is omitted or explained as necessary.

In the respective embodiment, portions having characteristic features are explained and explanation of portions not different from elements of an ordinal display device is omitted. In the respective embodiments, a liquid crystal display device is explained as a major example. However, as partly described in the respective embodiments, embodiments can be adopted for other display devices such as organic EL display device.

(First Embodiment)

According to the present embodiment, a display device substrate is described in which a low reflectance electrode pattern is provided, including three layers of first light absorption resin layer having a black colorant, a metal film pattern having alkali tolerance and further, a second light absorption resin layer having a black colorant.

FIG. 1 is a cross sectional view showing a first example of a display device substrate according to the present embodiment. In a case where the display device substrate according to the present embodiment is used for an organic EL display device, an organic EL display device including light emitting elements of three colors including organic EL elements that emit red light, organic EL elements that emit green light and organic EL elements that emit blue light is accomplished. When the display device substrate according to the present embodiment is used for a liquid crystal display device, a liquid crystal display device is accomplished in which a backlight unit having light emitting elements of three colors including LED elements that emit red light, LED elements that emit green light and LED elements that emit blue light is provided and the respective color LED elements and the respective liquid crystals located at respective pixels are driven by a field sequential method.

(Overall Configuration of Display Device Substrate)

The display device substrate 12 is provided with a transparent substrate 10, a first transparent resin layer 5 and a second transparent resin layer 7. As a transparent substrate 10, for example, a glass substrate is used. The first transparent resin layer 5 and the second transparent resin layer 7 are laminated on the transparent substrate 10 in this order. The first transparent resin layer 5 is formed to have a film thickness of 2 μm by using thermosetting acrylic resin. The second transparent resin layer 7 is formed to have a film thickness of 3 μm by using a photosensitive resin capable of being alkali-developed. For example, the second transparent resin layer 7 may be a photocurable resin adhesive.

As a film thickness of the second transparent resin layer 7, for example, a film thickness of 0.5 μm or more can be used in order to reduce electrical interference occurring with a pixel electrode 25 and a wiring of an active element included in an array substrate 23 that faces a display device substrate 12 as shown in the second embodiment which is described later. A resin material of the second transparent resin layer 7 may preferably be a resin material having small relative dielectric constant.

According to the first embodiment, a photosensitive resin capable of being exposed and developed is used for the second transparent resin layer 7. The second transparent resin layer 7 is formed in a rectangular shape only at a display portion in the transparent resin layer 10, the display portion being formed in an overall rectangular shape in planar view. In other words, the second transparent resin layer 7 is not formed in a terminal portion which is described later.

Figure 2:
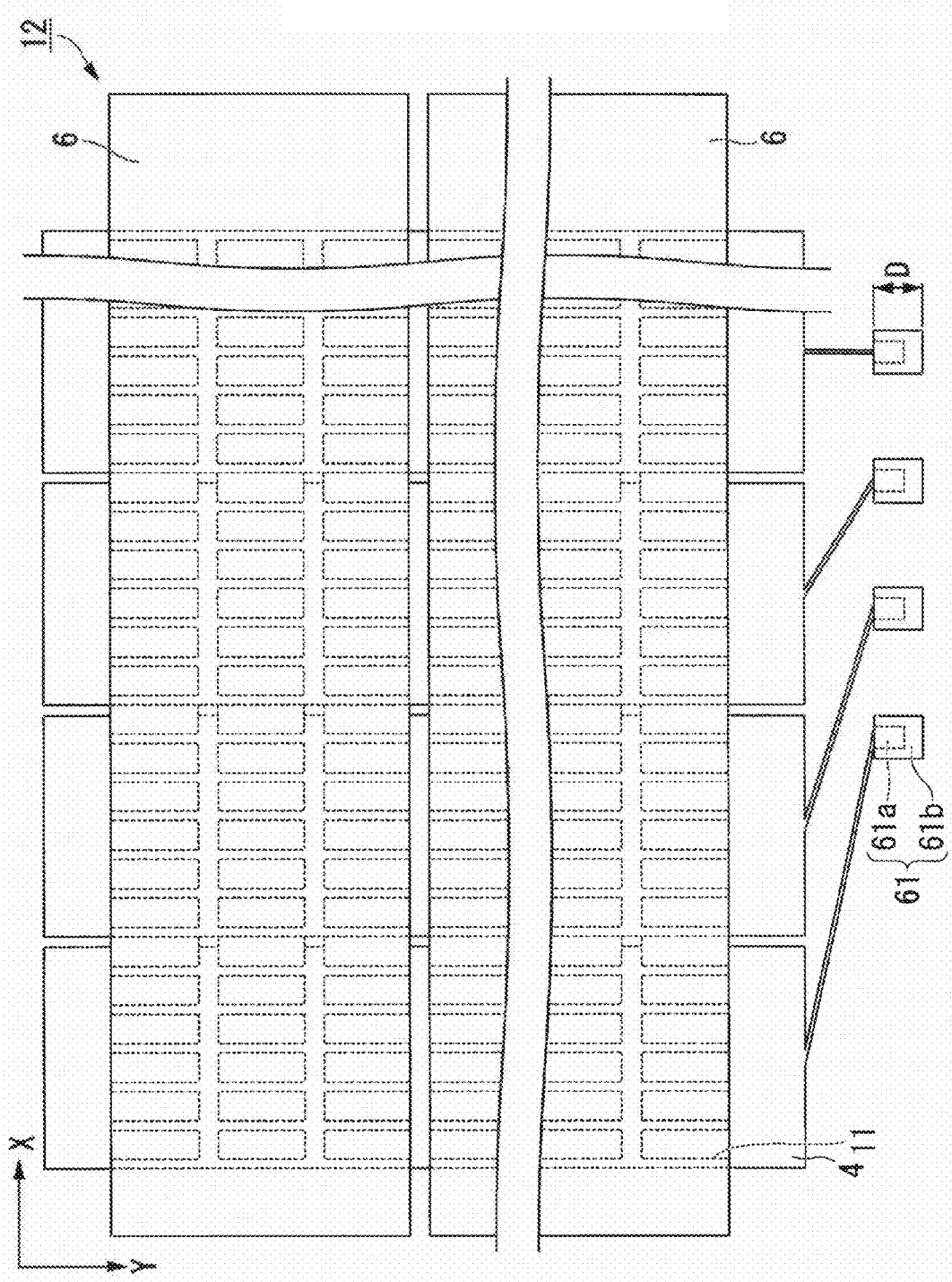
FIG. 2 is a planar view showing a display device substrate according to the first embodiment of the present invention

At a boundary surface between the transparent substrate and the first transparent resin layer 5, a pattern of low reflectance electrodes 4 is arranged. In FIG. 2, a planar view of the low reflectance electrodes 4 is illustrated. The low reflectance electrodes 4 have a partial pattern layout (arrangement) arranged in plural number, being in parallel with respect to the X-direction (first direction) as shown in FIG. 2 along the transparent substrate 10 and being mutually and electrically isolated. The low reflectance electrode 4 can be used as a detection electrode that detects a change in the electrostatic capacitance produced in a touch sensing operation or a drive electrode (scanning electrode) of touch sensing. Hereinafter, a case is described where the low reflectance electrode is used as mainly a detection electrode.

Figure 4:
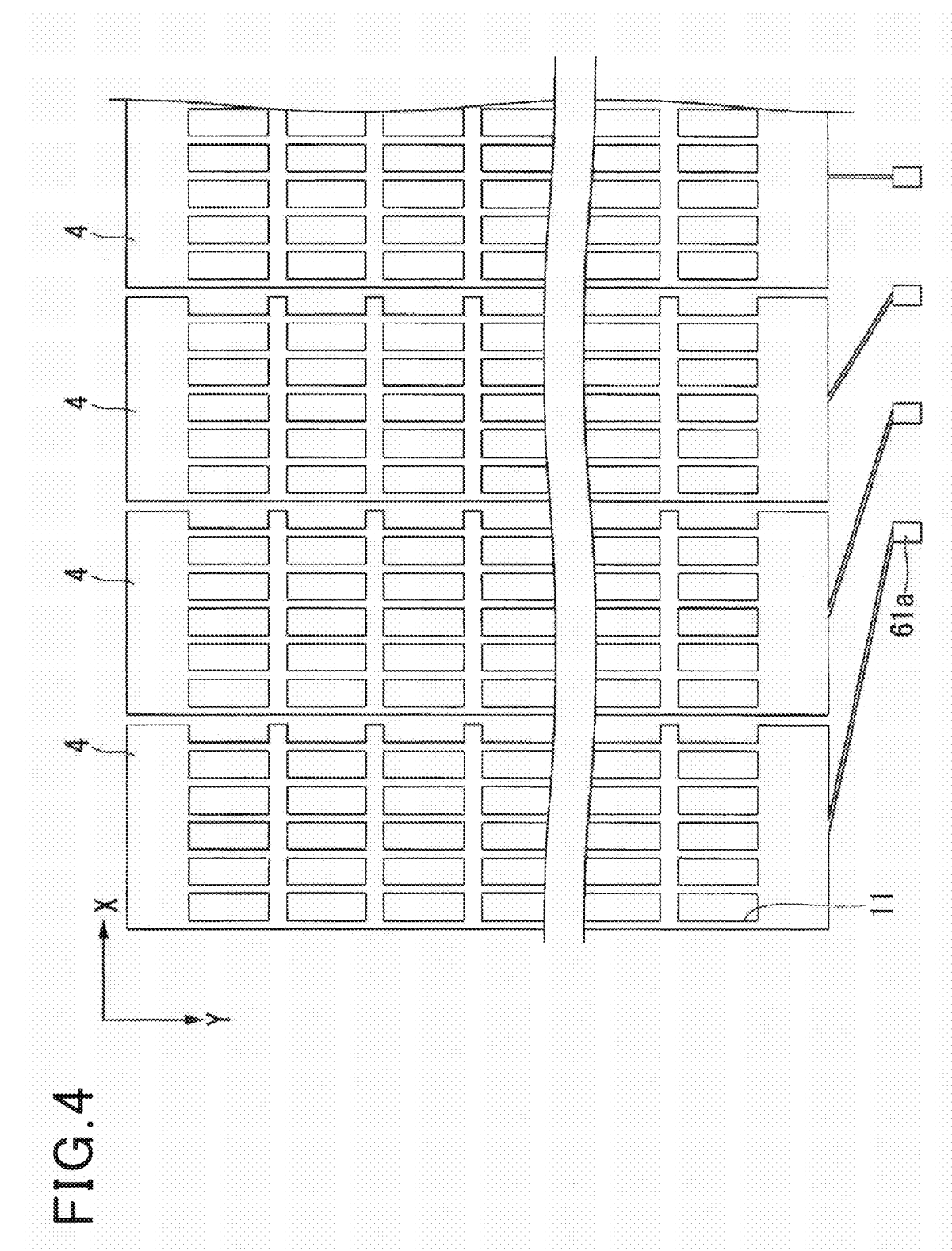
FIG. 4 is a planar view of a display device substrate in which a manufacturing method of the display device substrate according to the present invention is illustrated.

The partial pattern of a single low reflectance electrode 4 has six pixel openings 11 in the X-direction (refer to FIG. 4). The partial pattern of the single low reflectance electrode 4 has, for example, 480 pixel openings along the Y-direction in FIG. 2 (second direction). The Y-direction is defined as a direction along the transparent resin substrate 10 and perpendicular to the X-direction. The low reflectance electrodes 4 are patterned to be electrically isolated every six pixels in the X-direction. The partial pattern of the low reflectance electrode 4 is arranged in which the number of arranged partial patterns is 320, such that the number of pixels of the display device substrate 12 is 1920×480.

Figure 3:
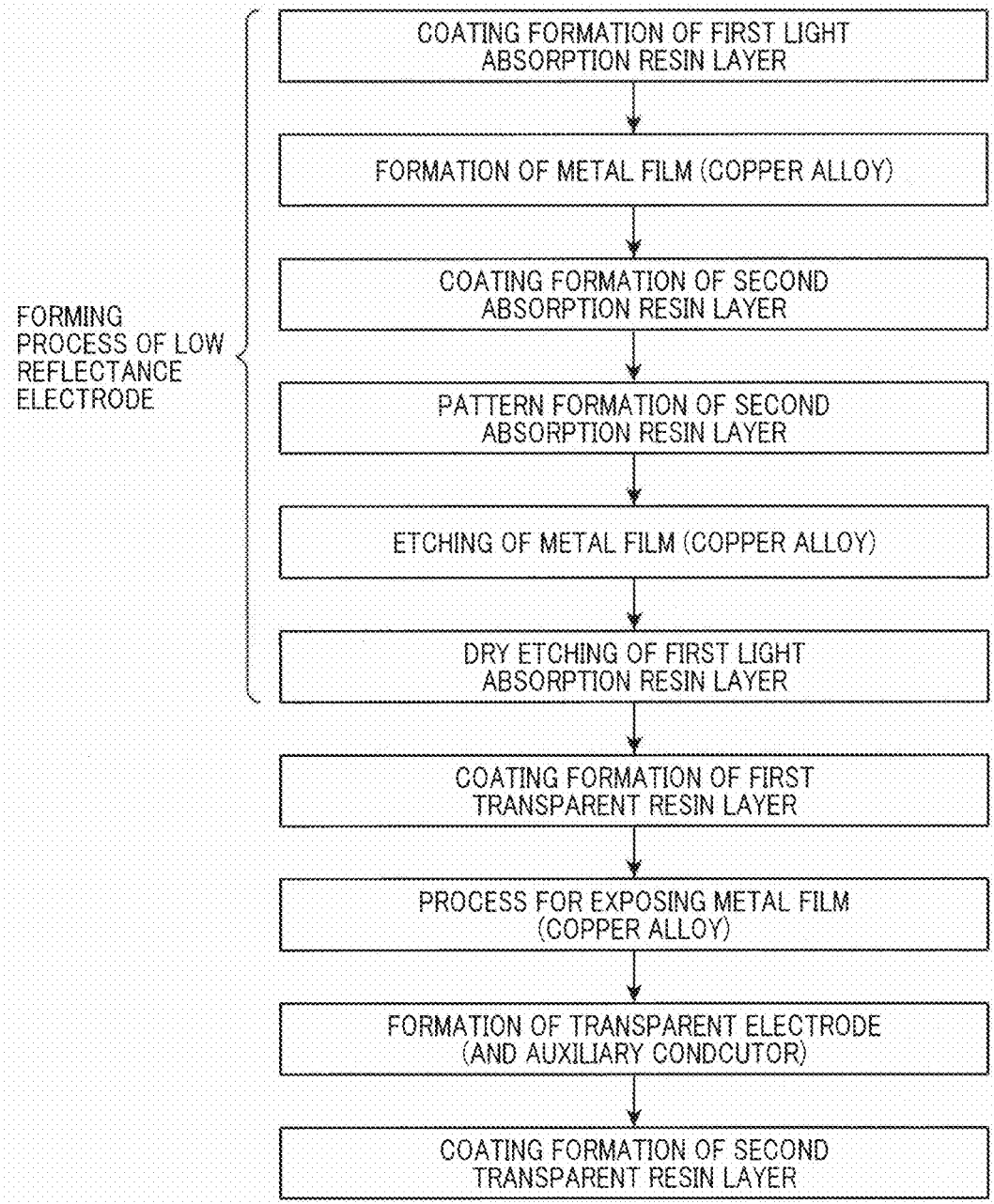
FIG. 3 is a flowchart showing a manufacturing method of a display device substrate according to the first embodiment of the present invention.
Figure 9:
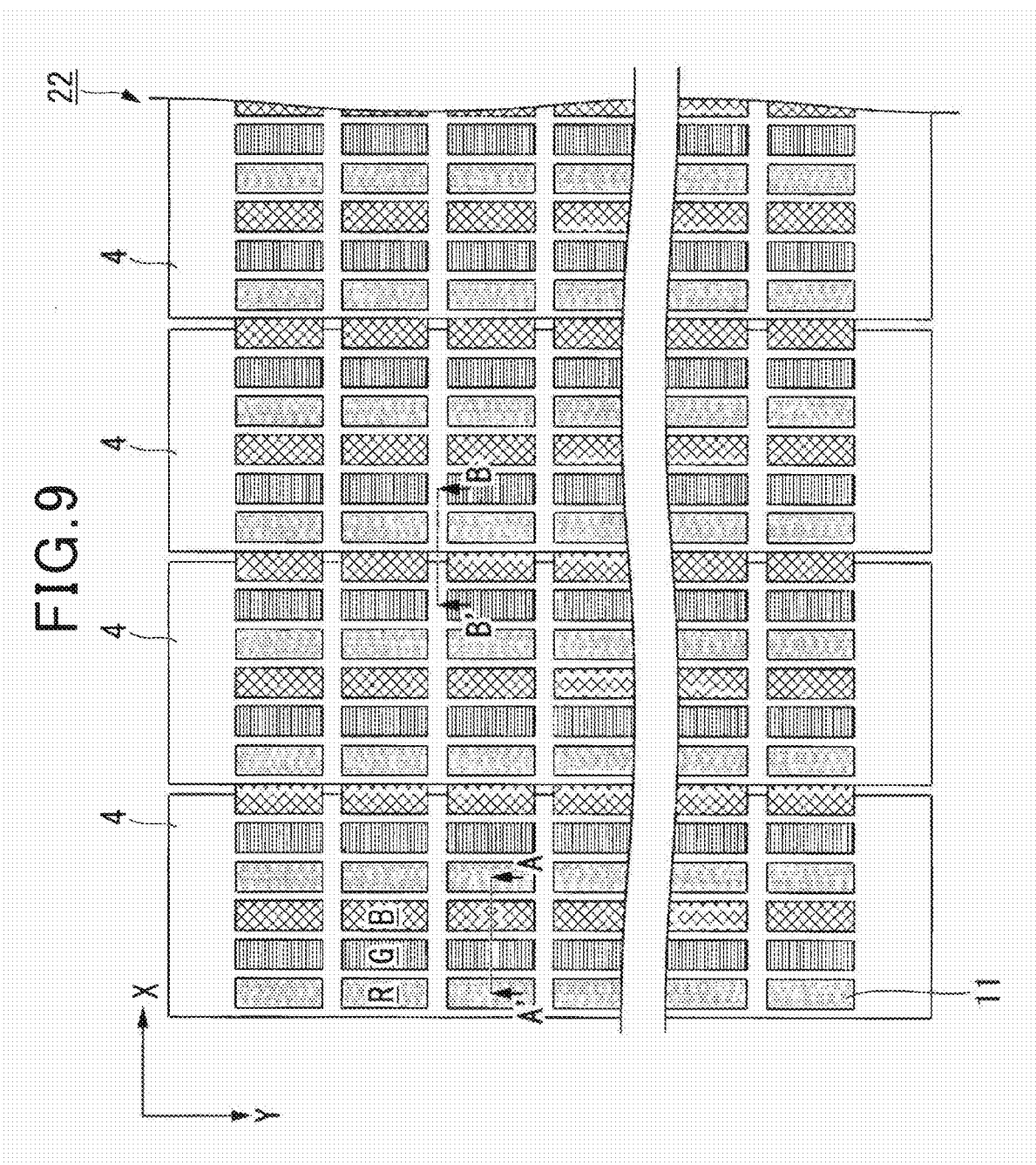
FIG. 9 is a planar view showing a display device substrate according to the third embodiment of the present invention.

The pattern width of the partial pattern of the low reflectance electrode 4 may be a pattern width corresponding to a single pixel to be included, or a pattern width corresponding to two or more pixels to be included. Moreover, in the low reflectance electrode 4, it is not necessary to use all of the partial patterns which are electrically isolated as a detection electrode of a touch signal. For example, the partial pattern can be used at every other pattern alternately. The partial pattern which is not used as a detection electrode may be a floating pattern which is electrically floated. The pattern shape of the low reflectance electrode 4 may be, for example as shown in FIG. 9, a frame shape that surrounds the periphery of the pixels or a comb tooth shape or a fishbone shape. A detected quantity of electrical noise in the vicinity of the display device varies depending on the pattern shape of the low reflectance electrode 4 including a case where the pattern is electrically closed in a planar view and a case where the pattern is open. On the other hand, the detected quantity of electrical noise in the vicinity of the display device varies depending on the pattern shape and area of the low reflectance electrode. For example, in a pattern which is electrically closed, the detection quantity of noise is small and, in a pattern which is electrically open, the detection quantity of noise is large. Here, by using two types of pattern of the low reflectance electrode 4 (two types of pattern of the low reflectance electrode 4 are disposed in the display device substrate 12), calculation (subtraction) of the electrostatic capacitance is performed based on electrostatic capacitance of the touch sensing operation, whereby noise compensation can be performed. A frame shape that surrounds the vicinity of the pixel as shown in FIG. 9 is applied to the display device substrate 12, thereby increasing the electrostatic capacitance (fringe capacitance, refer to FIG. 6) inherent in the edges of the lattice pattern of the low reflectance electrode 4. As shown in a schematic diagram of FIG. 7, the produced fringe capacitance is decreased when being touched with a finger or the like so that an extremely large difference of electrostatic capacitance can be obtained. Hence, S/N ratio can be improved. For example, according to the two mutually adjacent pairs of touch sensing electrodes structure disposed on the same plane as shown in FIG. 3 of the above-described PTL 3 (International Publication No. 2013/018495), a large amount of fringe capacitance is difficult to obtain as disclosed in the present invention.

As shown in FIG. 1 a pattern of the transparent electrode 6, using conductive metal oxide which is referred to as ITO, is provided with a film thickness of 140 nm at the boundary surface between the first transparent resin layer 5 and the second transparent resin layer 7. The transparent electrode 6 is the other touch sensing electrode paired with the low reflectance electrode 4. The transparent electrode 6 may be arranged in the X-direction and the low reflectance electrode 4 may be arranged in the Y-direction. In other words, an arrayed direction of the transparent electrode 6 and an arrayed direction of the low reflectance electrode 4 which are orthogonal to each other may be reversed, thereby using the transparent electrode 6 to be a touch sensing electrode.

As shown in FIG. 2, the transparent electrode 6 has a partial pattern layout (arrangement) arranged in plural number and parallel with respect to the Y-direction. The pattern of the transparent electrode 6 is formed on a first transparent resin layer 5 to be in a stripe shape perpendicular to a pattern of the low reflectance electrode 4. As described later, the transparent electrode 6 may include a thin pattern of a metal film to be an auxiliary conductor, the thin pattern extending in the longitudinal direction (length direction of the stripe, X-direction) of the partial pattern.

Each of the partial patterns of the low reflectance electrode 4 and the transparent electrode 6 has a terminal portion 61 which is a portion used for mounting. These terminal portions 61 are disposed in a region D of the terminal portion located outside the display portion of the overall rectangular shape. It should be noted that illustration of the terminal portion of the transparent electrode 6 is omitted in FIG. 2.

(Overall Configuration of Low Reflectance Electrode)

As shown in FIG. 1, the low reflectance electrode 4 of the present embodiment is constituted by a first light absorption resin layer 1, a metal film 2 and a second light absorption resin layer 3. These first light absorption resin layer 1, the metal film 2 and the second light absorption resin layer 3 are formed in the same shape when viewing in planar view. Therefore, the line width at the pattern of the first light absorption resin layer 1, the line width at the pattern of the metal film 2 and the line width at the pattern of the light absorption resin layer 3 are the same.

The film thickness of the low reflectance electrode 4 may preferably be 1 μm or less. When the thickness of the low reflectance electrode is low, roughness or projections on a surface of the display device substrate 12 are difficult to observe, for example, an alignment failure of liquid crystal can be avoided. According to the low reflectance electrode 4, for example, the film thickness of the first light absorption resin layer 1 can be set as 500 nm, the film thickness of the metal film 2 can be set as 180 nm and the film thickness of the second light absorption resin layer 3 can be set as 300 nm, and the overall film thickness of the low reflectance electrode 4 is 980 nm (0.98 μm).

(Light Absorption Resin Layer)

The first light absorption resin layer 1 prevents a light reflection at a surface of the liquid crystal display device being located at observer side, when the display device substrate 12 is applied to the liquid crystal display device. The second light absorption resin layer 3, for example, reduces light reflection in the liquid crystal layer.

For example, the first light absorption resin layer 1 and the second light absorption resin layer 3 are electrically insulators, electrically. For the light absorption resin layer 1 and 3, carbon can be used as a light absorption colorant, and a plurality of types of organic pigments can be further added to the carbon for color adjustment. For example, the optical density of the light absorption resin layers 1 and 3 in the transmittance measurement may be set as less than 2. For example, the optical density of the light absorption resin layers 1 and 3 measured by transmittance measurement may preferably range from 0.4 to 1.8 per 1 μm film thickness and the film thickness of the light absorption resin layers 1 and 3 may preferably range from 0.1 μm to 0.7 μm.

When the light absorption resin layers 1 and 3 are formed only using carbon as a colorant and the optical density of the light absorption resin layers 1 and 3 is 2, or 3 or more, the reflectance of light produced at the boundary surface between the transparent substrate 10 and the light absorption resin layers 1 and 3 may exceed 2%. For example, the reflectance of the black resin layer at the boundary surface between the transparent substrate and the black resin layer of the black resin layer (light absorption resin layer) is approximately 2%, in which the black resin layer is formed using carbon as a colorant, having an optical density of 2 and film thickness of 1 μm. In other words, when an amount of black colorant such as carbon added to the resin is too large, the reflectance is increased. Hence, an amount of addition may be relatively low so that the light absorption resin layers 1 and 3 have low reflectance. Since the low reflectance electrode according to the present invention is configured such that at least a metal film having alkali resistance is provided on the back surface of the light absorption resin layer 1, reflected light at the metal film is produced, if an amount of the addition of the black colorant in the light absorption layer is too small. To reduce light reflection from the metal film, the effective optical density of the light absorption resin layer is required to be 0.1 or more. The effective optical density is a value in which an optical density per 1 μm film thickness and the film thickness of the light absorption resin are accumulated. The optical density of the light absorption resin layer can be set within a range from 0.4 to 1.8 [/μm] and the reflectance with a film thickness of the light absorption resin layer when viewing from the transparent substrate can be adjusted to 0.9% or less. In the low reflectance electrode according to the present invention, the incident light coming from outside the display device passes through the transparent substrate and the first light absorption resin layer once and is reflected at a boundary surface between the metal film and the first light absorption resin layer. Then, the incident light passes through the first light absorption resin layer and the transparent resin layer again. Since, the incident light passes through the first light absorption resin layer twice, the intensity of the light including the incident light and the reflected light are significantly attenuated, thereby producing reflected light of which the light intensity is attenuated.

The optical density of the light absorption resin layers 1 and 3 can be adjusted based on an amount of a black colorant such as carbon or a plurality of organic pigments added to a resin. To obtain a pattern of the light absorption resin layers 1 and 3, a photosensitive black coating liquid is coated to the transparent substrate 10, exposed in a desired pattern and developed, then cured by heat treatment or the like. For example, the photo sensitive black coating liquid is produced in which a carbon is dispersed into a mixture of a photo-cross-linkable acrylic resin and an initiator.

For the first light absorption resin layer 1, thermosetting resin can be used. For the second light absorption resin layer 3, a black coating liquid in which a photosensitive resin capable of being alkali-developed and a black colorant are dispersed into an organic solvent can be used. A refractive index used for these resins may preferably be low. By adjusting the refractive index of the resin to be used, content of the black colorant such as carbon and the film thickness of the first light absorption resin layer 1, the reflectance at the boundary surface between the first light absorption resin layer 1 and the transparent substrate 10 when viewing from the transparent substrate 10 can be 0.9% or less. However, the reflectance of the resin to be used is limited so that the lower limit of the reflectance is 0.2%. When the solid content of the resin such as acrylic resin contained in the black coating liquid is, for example, 14% mass and an amount of carbon contained in the black coating liquid is set within a range approximately from 6% mass to 25% mass, the optical density of the light absorption resin layers 1 and 3 can be 0.4 to 1.8 per 1 μm film thickness. When the film thickness of the light absorption resin layers 1 and 3 is 0.3 μm, the effective optical density is from 0.12 to 0.54. When the film thickness of the light absorption resin layers 1 and 3 is 0.7 μm, the effective optical density is from 0.28 to 1.26.

(Metal Film)

The metal that forms the metal film 2 is a copper alloy. In a case where a copper alloy thin film is used and the film thickness of the metal film 2 is 100 nm or more, or 150 nm or more, almost no visible light permeates the metal film 2. Therefore, the low reflectance electrode 4 according to the present embodiment is able to obtain sufficient light shielding properties, when the film thickness of the metal film 2 is, for example, from 100 nm to 200 nm. As described later, a part of the metal film 2 in the thickness direction may be formed as a metal film including oxygen.

The metal film 2 may be a metal film having alkali tolerance. A case where the alkali tolerance is required for example is a case where a development process is present in the post-process using alkali-development liquid. Specifically, for example, one case is where a pattern-forming process for a color filter or a black matrix is present. In this case, a metal film 2 which tolerates the alkali development liquid is required.

In terms of tolerating alkali development liquid, aluminum or aluminum alloy are difficult to apply. It should be noted that chromium has alkali tolerance, which can be applied as a metal film 2 of the low reflectance electrode 4. However, the resistance value is large and chrome ion produced in the manufacturing process is hazardous. Hence, the chromium is difficult to be applied to practical manufacturing.

A metal having alkali tolerance includes various elements such as copper, silver, gold, nickel, titanium and molybdenum. In view of the resistance value and the manufacturing cost, a copper or a copper alloy may preferably be used. As a metal having alkali tolerance, nickel as a single metal can be applied. However, since the nickel is ferromagnetic, a film formation rate in a sputtering film-formation is low so that productivity is relatively worse. As for nickel, copper-nickel alloy containing 4 at % or more nickel can be applied to the present invention. For example, first, the copper-nickel alloy containing 4 at % or more nickel is formed as a thin film in which 5 at % or more oxygen is intentionally included, having a thickness of 5 nm to 20 nm. Further, the copper-nickel alloy having a film thickness of about 100 nm to 300 nm where oxygen is not substantially included, is laminated on a thin film of the above-described copper-nickel alloy. A laminated thin film which is laminated in this way can be used as an electrode for touch sensing having reflectance 30% or less. Having 5 at % or more oxygen contained in the copper-nickel alloy, the reflected color becomes black. A reflectance of 0.9% or less can be obtained by inserting the first light absorbing resin layer 1 at the boundary surface between the transparent substrate 10 and the metal film 2 which is copper-nickel alloy.

To obtain adhesion properties with a glass substrate and a resin, the metal that forms the metal film 2 is preferably a copper alloy in which one or more metal elements selected from magnesium, calcium, titanium, molybdenum, indium, tin, zinc, aluminum, beryllium and nickel is added to the copper. In other words, the copper is an excellent conductor having low electrical resistance and having excellent alkali resistant properties. However, adhesion to a glass or a resin is not sufficient. In this respect, by using copper alloy including the above-described material, adhesive properties to the glass and the resin can be improved.

An amount of additive of the metal elements may preferably be 3 at % or less, since the resistance value of the copper alloy is not significantly decreased. When an amount of additive of the metal element is 0.2 at % or more, adhesive properties of the thin film of the copper alloy are improved. The metal that forms the metal film 2 in the present embodiment and the following embodiments is a copper alloy containing 1 at % magnesium (the remnant is copper), unless otherwise specified in the following description. The resistance value of copper alloy containing magnesium 1 at % is not significantly different from a case when only copper is used. The film forming of the copper alloy can be performed by, for example, a vacuum film formation in the sputtering. In the distribution of alloy elements to be added, a concentration gradient may be present in a film thickness direction of the copper alloy. The central region in the thickness direction of the metal film 2 may contain 99.8 at % or more of copper. Concerning a surface that contacts with a light absorption resin layer in the thickness direction of the metal film 2 or an opposite surface that faces the surface that contact with the light absorption resin layer, a concentration gradient may be present in which an amount of alloy elements on a surface of the metal film 2 is larger than that of the central region in the thickness direction of the metal film 2. In the film formation of the copper alloy, by introducing oxygen, a copper alloy containing oxygen can be used in a film formation of a film thickness region from 2 nm to 20 nm of the copper alloy on the surface that contacts with the first light absorption resin layer. An amount of oxygen being introduced during the film formation can be, for example, 10% with respect to an amount of base gas such as argon to be introduced. The alloy film in the region of 2 nm to 20 nm contains, for example, 5 at % or more oxygen, thereby improving adhesive properties of the metal film 2 which is a copper alloy. As for the content of oxygen, an improvement of adhesive properties is saturated at 15 at % thereof. The total film thickness of the metal film 2 which is a copper alloy containing an alloy film in a region of 2 nm to 20 nm can be, for example, 102 nm to 320 nm. The copper alloy film containing oxygen is formed on a surface of the metal film 2, whereby the reflectance of the metal film 2 itself can be lowered so that an effect of low reflectance as a low reflectance electrode can be enhanced.

In a manufacturing step of the display device substrate, when strong alkali liquid is not used, an aluminum alloy can be used for a metal of the metal film 2. As described later, according to the present embodiment, since a forming step of a color filter using alkali developer does not exist, aluminum alloy can readily be applied. The aluminum alloy can be an alloy in which alloy elements are added to aluminum within a range of 0.2 at % to 3 at %. One or more alloy elements can be selected from magnesium, calcium, titanium, indium, tin, zinc, neodymium, nickel and copper.

(Manufacturing Method of Display Device Substrate)

In FIG. 3, major steps in the manufacturing method of the display device substrate according to the present embodiment are shown. In a coating formation of the first light absorption resin layer 1, the above-described black coating liquid is used and the film thickness formed is 0.5 µm. In a coating formation of the second light absorption resin layer 3, considering that a film thinning at the dry etching is carried out in the post-process, the film thickness formed is 0.8 µm. According to a configuration in which the second light absorption resin layer 3 is not directly laminated on the metal film 2, the film thickness of the first light absorption resin layer 1 may be 0.7 µm. The film thickness of the first light absorption resin layer 1 and the density of the carbon colorant are adjusted, whereby light reflection produced at a boundary surface between the transparent substrate 6 and the light absorption resin layer 1 can be adjusted.

As described, a photosensitive black coating liquid capable of being alkali-developed is used for the second light absorption resin layer 3. For the pattern forming of the second light absorption resin layer 3, with a conclusive pattern shape of the low reflectance electrode 4, the pattern is exposed, developed and cured. As shown in a manufacturing process flow of FIG. 3, after forming a pattern of the second light absorption resin layer 3, the metal film 2 (copper alloy film) is etched to form the metal film 2 having a pattern which is identical to the pattern of the second light absorption resin layer 3

An etching of the metal film 2 can be accomplished by a wet etching method or a dry etching method. In wet etching, for example, an alkali etchant having oxidizability can be used. For dry etching, dry etching using a halogen gas such as chlorine gas or a dry etching or the like in which an oxygen gas and an organic acid vapor are alternately used can be employed.

Next, with a dry etching method using an oxygen gas, an argon gas and a freon gas, the first light absorption resin layer having thickness 0.5 µm located outside the pattern of the metal film 2 is removed to form a pattern of a low reflectance electrode 4. Here, the dry etching can be referred to as ashing of which the target is the first light absorption resin layer 1. Similar to the first light absorption resin layer 1, the second light absorption layer 3 has a thickness of 0.3 µm where 0.5 µm corresponding to an amount of film-thinning has been reduced. Since the film thickness of the metal film 2 is 0.15 µm (150 nm), the total film thickness of the low reflectance electrode 4 becomes 0.95 µm. In the metal film 2 having a film thickness 0.15 µm, a portion having 0.01 µm film thickness contacting with the first light absorption resin layer 1 was formed with a copper alloy film containing oxygen. The oxygen gas was introduced only when this copper alloy film having 0.01 µm film thickness is formed. As for the flow rate of the respective gases, the flow rate of an oxygen gas and an argon gas is 1:10.

The low reflectance electrode 4 is formed with the above-described manner. It should be noted that after dry etching and ashing, the target substrate may preferably be washed and dried sufficiently before the next process. The copper oxide produced on the surface of the metal film 2 can be removed, for example, a dry etching using an organic acid vapor. Subsequently, the first transparent resin layer 5, the transparent electrode 6 and the second transparent resin layer 7 are laminated on the transparent substrate 10, thereby forming the display device substrate 12.

According to the present embodiment, in parallel to a forming process of the low reflectance electrode 4, as shown in FIG. 4, a partial pattern of the low reflectance electrode 4 is extended so as to form the base terminal 61a where the metal film 2 is exposed. Here, FIG. 4 corresponds to a planar view during the manufacturing process where a pattern of the transparent electrode 6 and the second transparent resin layer 7 are not laminated. When forming the low reflectance electrode 4, the partial pattern of the low reflectance electrode 4 is extended to the region D of the terminal portion.

Specifically, in the coating formation of the first light absorption resin layer 1, formation of the metal film 2 and coating formation of the second light absorption resin layer 3, the light absorption resin layers 1 and 3 and the metal film 2 are formed not only in the display portion having an overall rectangular shape but also in the region D of the terminal portion. When forming a pattern of the second light absorption resin layer 3, in the light absorption resin layer 3, a portion located above a portion of the base terminal 61 being formed is also removed. Further, when performing dry-etching of the metal film 2 and the first light absorption resin layer 1, the metal film 2 and the light absorption resin layer 1 are removed, leaving a portion where the base terminal 61*a* is formed.

After coating formation of the first transparent resin layer 5 on the base terminal 61*a*, the transparent resin layer 5 is removed with a method such as dry etching (ashing) so as to expose the metal film 2. Then, at a time of forming the transparent electrode 6, as shown in FIG. 2, the base terminal 61*a* is covered with a pattern of a transparent conductive film (cover terminal) 61*b* which is a conductive oxide such as ITO. The transparent conductive film 61*b* is the same as the conductive film used for the transparent electrode 6. In other words, the transparent electrode 6 is formed by using a transparent conductive film which is pattern-formed with a well-known photolithography method.

The terminal portion 61 is formed by the base terminal 61*a* and the transparent conductive film 61*b*. The transparent conductive film 61*b* is formed in a shape to surround the base terminal 61*a*. The transparent conductive film 61*b* is directly attached to the transparent substrate 10, achieving a reliable mounting. When the pattern width of the transparent conductive film 61*b* is wide, the mounting can readily be accomplished. Hence, the transparent resin layer 5 or the light absorption resin layers 1 and 3 may be provided under the transparent conductive film 61*b* as an under layer thereof.

(Measurement Example of Reflectance)

The reflectance at the boundary surface between the low reflectance electrode 4 and the transparent substrate 10 according to the present embodiment was 0.8%. For the reflectance, a reflectance of aluminum vapor deposition film is determined as 100%. In the measurement, a microspectrophotometer (e.g., manufactured by Otsuka Electronics Co., Ltd LCF-1100) was used.

(Second Embodiment)

The second embodiment is an example in which a display device substrate 12 according to the first embodiment is applied to a liquid crystal display device referred to as Fringe Field Switching (FFS) or IPS types.

(Overall Configuration of Display Device Substrate)

Figure 5:
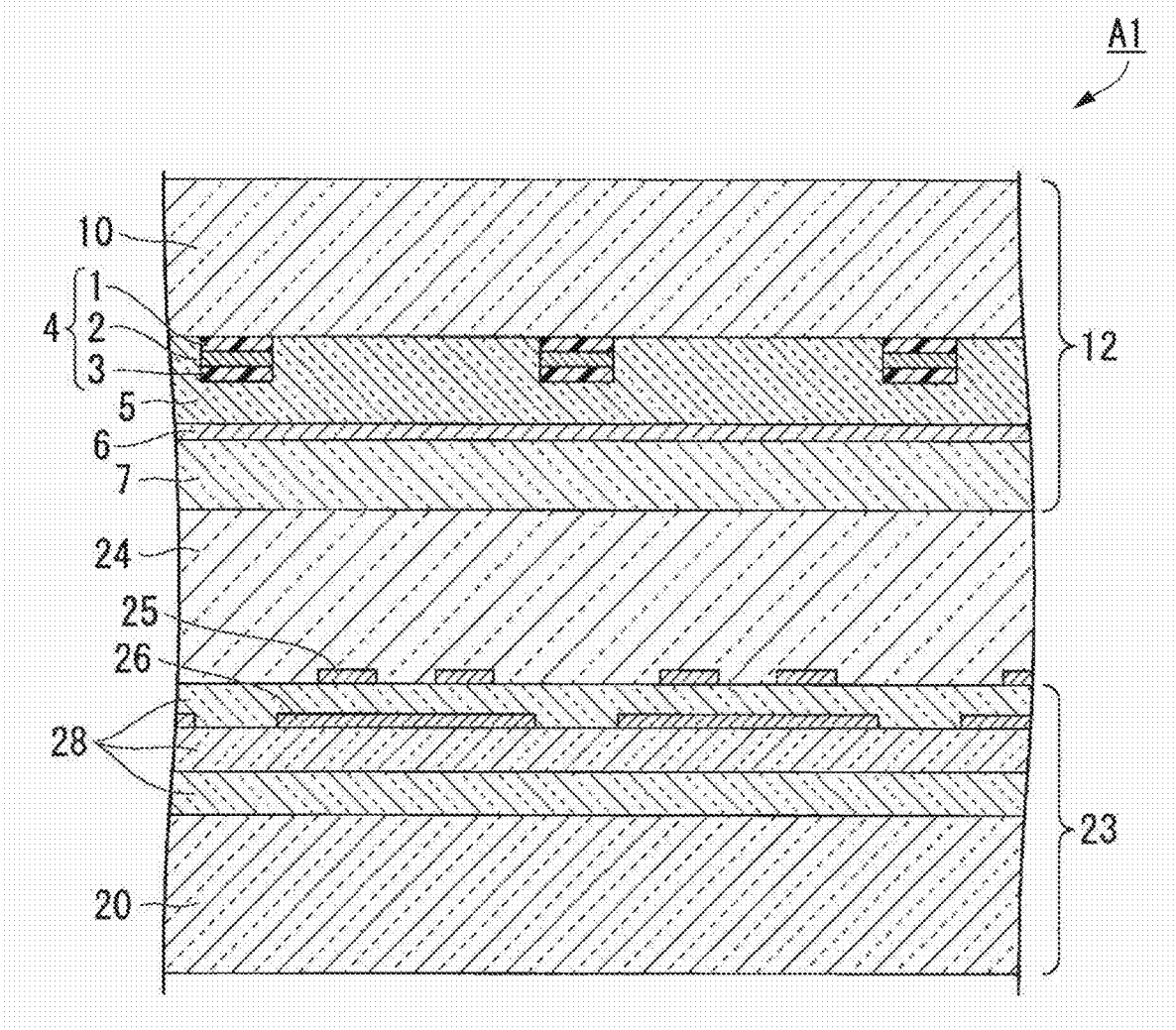
FIG. 5 is a cross sectional view showing a display device according to the second embodiment of the present invention.

A partial cross sectional view of the liquid crystal display device according to the second embodiment is shown in FIG. 5. A display device A1 includes the display device substrate 12 and an array substrate 23. The display device substrate 12 is attached to the array substrate 23 via the liquid crystal layer 24 so that they are faced each other. According to the display device substrate 12, the low reflectance electrode 4 serves as a low reflectance black matrix when viewing from the display surface.

The array substrate 23 is provided with an active element (TFT, thin film transistor) of which illustration is omitted. The active element may be configured as a transistor having a silicon semiconductor as a channel layer. However, a transistor having an oxide semiconductor used as a channel layer may preferably be used. A metal wiring in the array substrate 23 side may preferably be a copper wiring. As oxide semiconductors, for example, a composite oxide consisting of indium, gallium and zinc (IGTO, registered trademark) can be exemplified. Moreover, as a material of the oxide semiconductors, two or more types of metal oxides among gallium, indium, zinc, tin and germanium may be employed. For a metal wiring that electrically connects thin film transistors in the array substrate, a multilayer configuration having two or more layers of a copper or a copper alloy and high melting metal such as titanium or molybdenum can be employed. Furthermore, transistors having an oxide semiconductor for the channel layer have high electron mobility. Specifically, a required drive voltage can be applied to the pixel electrode 25 in a short period of time which is 2 milliseconds or less. For example, even in a case where double speed driving (having 120 display frames per second) is used, one frame corresponds to approximately 8.3 milliseconds. For example, a period of 6 milliseconds or more (approximately 8 milliseconds–2 milliseconds) can be assigned to a touch sensing operation. Since a transistor having an oxide semiconductor used for the channel layer has small leak current, the drive voltage applied to the pixel electrode 25 can be kept on for a longer period. A signal line, a scanning line and an auxiliary capacitance line of the active element are formed with a copper line having a wiring resistance smaller than the aluminum wiring and further, IGZO as an active element is used, being driven in a short period time. Accordingly, a margin of time in a scanning operation of the touch sensing is extended so that a change in produced electrostatic capacitance can be detected accurately. The oxide semiconductor such as IGZO is applied to an active element, thereby shortening a drive period of liquid crystal or the like. Therefore, a time assigned to a touch sensing operation has sufficient margin in video signal processing for the whole display screen. An array substrate provided with a transistor having an oxide semiconductor used for a channel layer and a copper wiring can be applied to the display device substrate according to the present invention.

In the array substrate 23, the pixel electrode 25 and a common electrode 26 are provided on the transparent substrate 20 via an insulation film 28. The liquid crystal molecules (illustration of alignment film and liquid crystal molecules is omitted) of the liquid crystal layer 24 are aligned to be in parallel to the respective surfaces of the array substrate 23 and the display device substrate 12. The liquid crystal molecules are rotated on the array substrate 23 by applying a drive voltage between the pixel electrode 25 and the common electrode 26, thereby performing On/Off operation of the display.

For the liquid crystal display device using an FFS method, only an alignment film is formed on the second transparent resin layer 7, that is, the transparent conductive film is not required to be formed on the second transparent resin layer 7. In FIG. 5, illustration of an alignment film, a polarizing plate and a phase difference plate are omitted.

(Effects of Second Transparent Resin Layer)

According to the display device A1, although a drive method of the liquid crystal uses In-Plane Switching, i.e., IPS, the film thickness of the second transparent resin layer 7 is set to be, for example, within a range from 0.3 μm to 6 μm or larger than or equal to 6 μm, whereby a decrease of the transmittance of the display device A1 can be avoided.

In more detail, for example, in a configuration where the second transparent resin layer 7 is not formed, the line of electric force produced between the pixel electrode 25 and the common electrode 26 are distorted when voltage for driving the liquid crystal voltage is applied. In other words, the shape of the line of electric force is slightly deformed to be enclosed in the transparent electrode 6. Hence, the transmittance is decreased.

In contrast, the second transparent resin layer 7 is laminated on the transparent electrode 6, thereby forming lines of electric force that spread uniformly in the thickness direction of the second transparent resin layer 7. Thus, the liquid crystal molecules in the liquid crystal cell can be used sufficiently in the thickness direction. In other words, by laminating the second transparent resin layer 7 on the transparent electrode 6, the transmittance will be improved, since quantity of liquid crystal molecules used for effectively improving the transmittance is increased. The relative dielectric constant of the second transparent resin layer 7 may preferably be close to a relative dielectric constant of the liquid crystal molecules or almost the same or lower.

(Effects of Low Reflectance Electrode)

According to the display device A1, the low reflectance electrodes 4 are used as a so-called detection electrode during a touch sensing operation and the transparent electrode 6 can be used as a drive electrode (scanning electrode) that applies voltage having constant frequency to the low reflectance electrodes 4.

Figure 6:
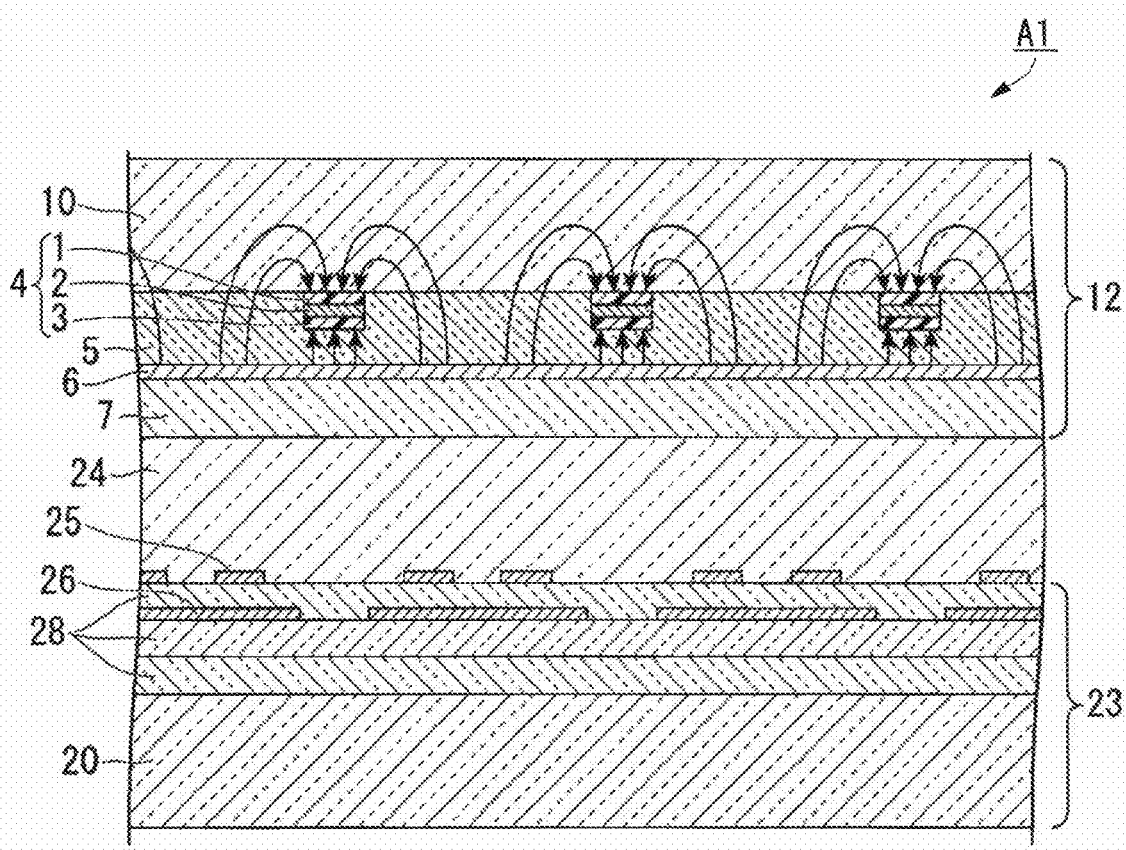
FIG. 6 is a cross sectional view showing an effect of the display device according to the second embodiment of the present invention.

Specifically, as shown in FIG. 6, the electrostatic capacitance for the touch sensing operation is held between the low reflectance electrode 4 and the transparent electrode 6. In a normal state, a constant voltage with a constant frequency is applied between the low reflectance electrode 4 and the transparent electrode 6 and uniform electric power line is formed at the vicinity of the low reflectance electrode 4.

Figure 7:
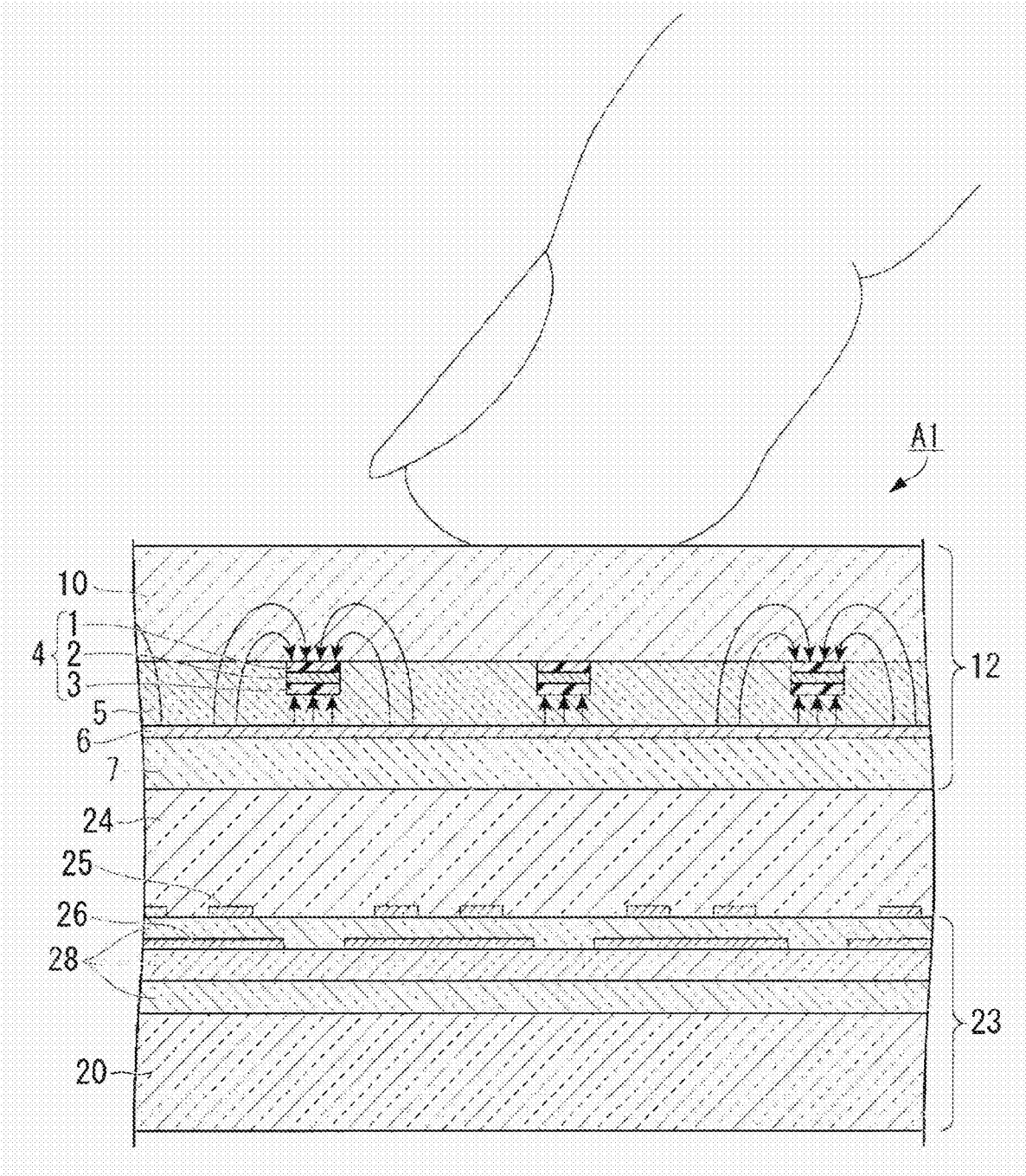
FIG. 7 is a cross sectional view showing an effect of the display device according to the second embodiment of the present invention.

As shown in FIG. 7, for example, when a pointer such as a finger approaches or touches the display screen, the distribution of the lines of electric force is disturbed. Then electrostatic charge is moved towards the pointer such as a finger, causing a decrease of electrostatic capacitance between the low reflectance electrode 4 and the transparent electrode 6. Whether or not the pointer such as a finger touches the display screen is recognized with a change in the electrostatic capacitance.

The low reflectance electrode 4 includes a metal film 2 of copper alloy having low resistance, thereby being used as a detection electrode for the touch sensing operation. The transparent electrode 6 according to the present embodiment widens the width of the pattern in order to lower the resistance. Further, an auxiliary conductor 16 which is described later can be provided on the transparent electrode 6 in order to lower the resistance. Therefore, in the two pairs of plurality of electrode groups in the electrostatic capacitance method according to the present embodiment, the time constant inherent therein can be significantly reduced. Thus, the detection accuracy during the touch sensing operation can be improved. FIGS. 6 and 7 are an explanatory diagram showing a change in an electrostatic capacitance before/after the touch sensing operation. Usually, a pointer such as a finger influences a plurality of detection electrodes at the same time.

(Third Embodiment)

Figure 8:
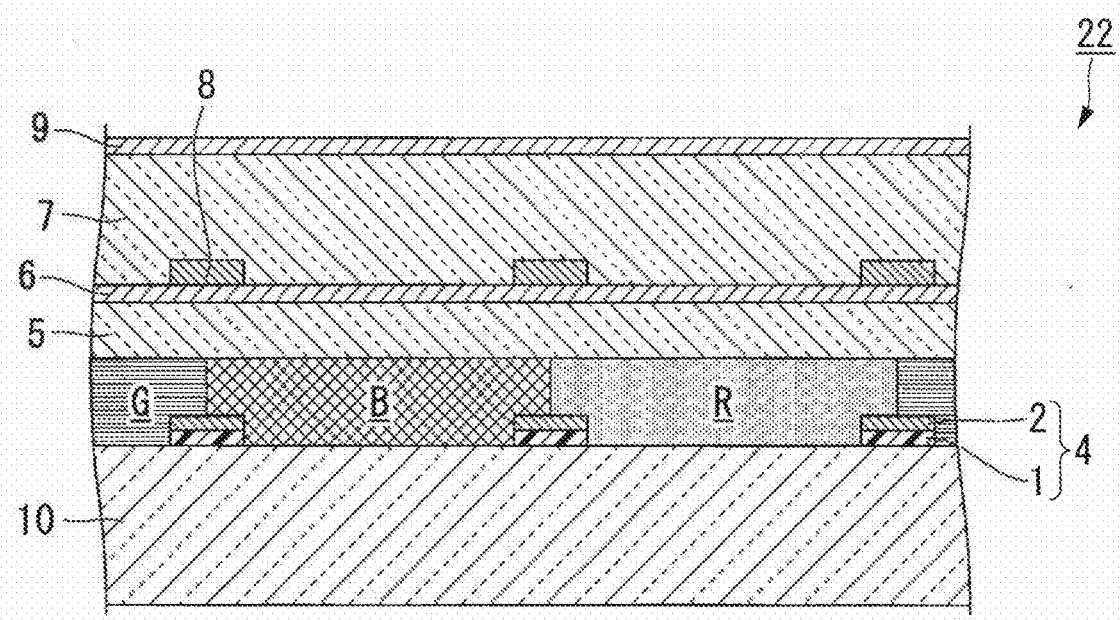
FIG. 8 is a cross sectional view showing a display device substrate according to the third embodiment of the present invention.

FIG. 8 is a cross sectional view showing a second example of the display device substrate according to the present embodiment. Specifically, FIG. 8 is a cross sectional view showing an example of the display device substrate provided with red, green and blue color filters according to the present embodiment.

For example, in a case where the display device substrate of the present invention is applied to an organic EL display device, an organic EL display device is accomplished in which a white organic EL device including at least red, green and blue light emitting components is used and provided with red, green and blue color filters, thereby performing the display operation. For example, in a case where the display device substrate of the present invention is applied to the liquid crystal display device, a liquid crystal display device is accomplished in which a backlight unit is provided with a white LED element including light emitting components of red, green and blue, and color filters of red, green and blue, thereby performing the display operation.

(Overall Configuration of Display Device Substrate)

The display device substrate 22 is constituted by the transparent substrate 10, a pattern of the low reflectance electrode 4, blue pixel B, red pixel R, green pixel G, the first transparent resin layer 5, a pattern of the transparent electrode 6, a black matrix 8, the second transparent resin layer 7 and the common electrode 9. According to the present embodiment, the low reflectance electrode 4 is constituted of two layers including the first light absorption resin layer 1 having a film thickness of 0.7 μm and a metal film 2 having a film thickness of 0.2 μm, in which the first light absorption resin layer 1 and the metal layer 2 have the same shape in planar view. In the metal film 2 having a film thickness of 2 μm, a portion corresponding to a film thickness of 0.015 μm is set to be copper alloy film containing oxygen of 8 at %. The film thickness of the first light absorption resin layer 1 and the density of the carbon colorant are adjusted, whereby a light reflection produced at a boundary surface between the transparent substrate 6 and the light absorption resin layer 1 can be adjusted.

FIG. 9 is a planar view showing a display device substrate according to the third embodiment, when viewing from the transparent substrate 10. For the pixel openings 11, any of red pixels R, green pixels G or blue pixels B is arranged without any gaps. Similar to the above-described first embodiment 1, the low reflectance electrode 4 is arranged in plural number, being in parallel to the X direction and having mutually and electrically isolated partial pattern layout (arrangement).

Figure 10:
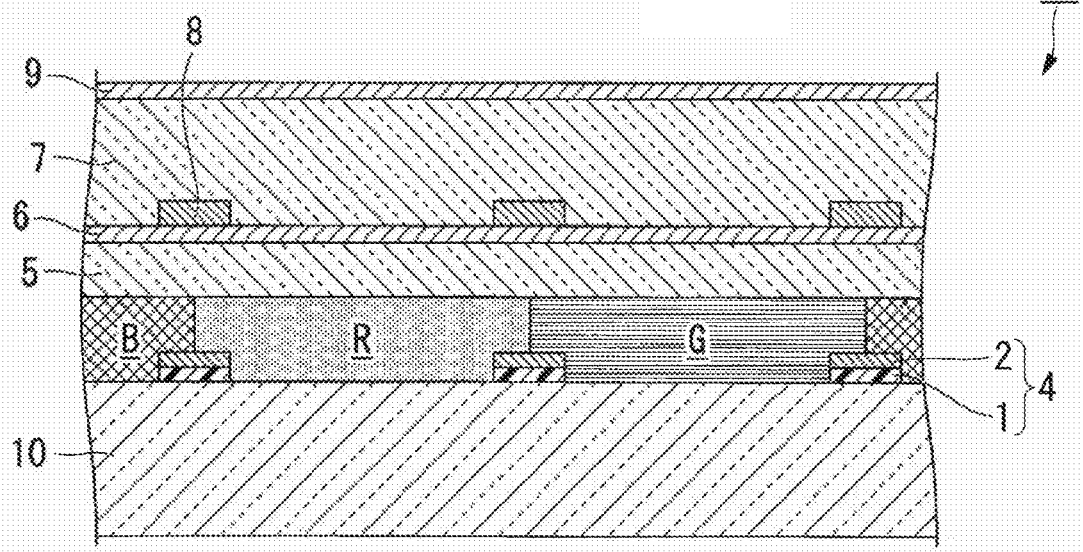
FIG. 10 is an arrow view showing a cross section taken along arrows A-A' as shown in FIG. 9.

In FIG. 10, a partial cross sectional view taken at A-A' direction in FIG. 9 is shown. On the transparent substrate 10 and the low reflectance electrode 4, any of the red pixels R, the green pixels G and the blue pixels B is arranged as a color filter without any gaps. The blue pixels B, the red pixels R and the green pixels G are formed with a well-known photolithography method such that each of a plurality of organic pigments is dispersed in a transparent resin such as acrylic resin.

The first transparent resin layer 5 is laminated on the color filters. Further, the transparent electrode 6, the black matrix 8, the second transparent resin layer 7 and the common electrode 9 are laminated on the first transparent resin layer 5 in this order. The transparent electrode 6 and the common electrode 9 are formed on different layers. However, with the same material, for example, the transparent electrode 6 and the common electrode 9 can be formed with a transparent conductive film such as conductive metal oxide referred to as ITO.

Figure 11:
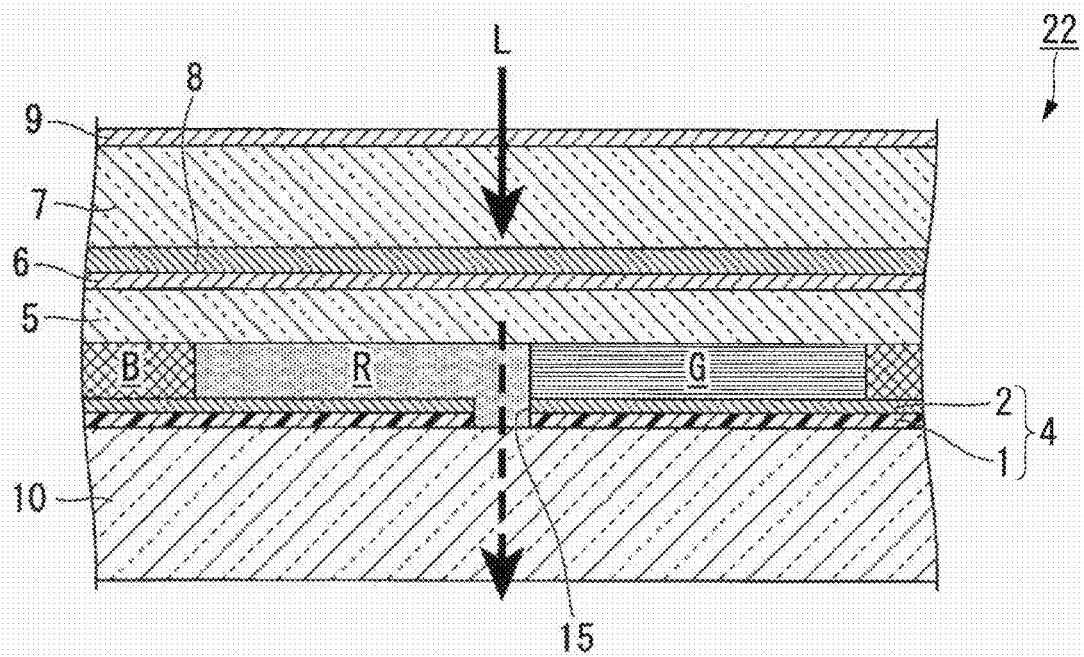
FIG. 11 is an arrow view showing a cross section taken along arrows B-B' as shown in FIG. 9.

FIG. 11 illustrates a partial cross sectional view which is taken across the line B-B' of FIG. 9. As described above, the partial pattern of the low reflectance electrode 4 is electrically isolated. The separate portions 15 are provided between respective partial patterns corresponding to the low reflectance electrodes 4 in the X direction. The black matrix 8 is provided on the separate portion 15. The light L entering the display device substrate from the back light unit is shielded by the black matrix 8. Alternatively, although the black matrix 8 is not formed, a wiring layout can be employed in which the metal wiring is arranged to cover (overlap) the separate portions 15 when viewing from a planar view, by using any one of source wiring 41, gate wiring 42 and auxiliary capacitance wiring 43 provided on the array substrate which is described later. Accordingly, light leakage from the backlight unit can be prevented.

(Auxiliary Conductor)

Figure 12:
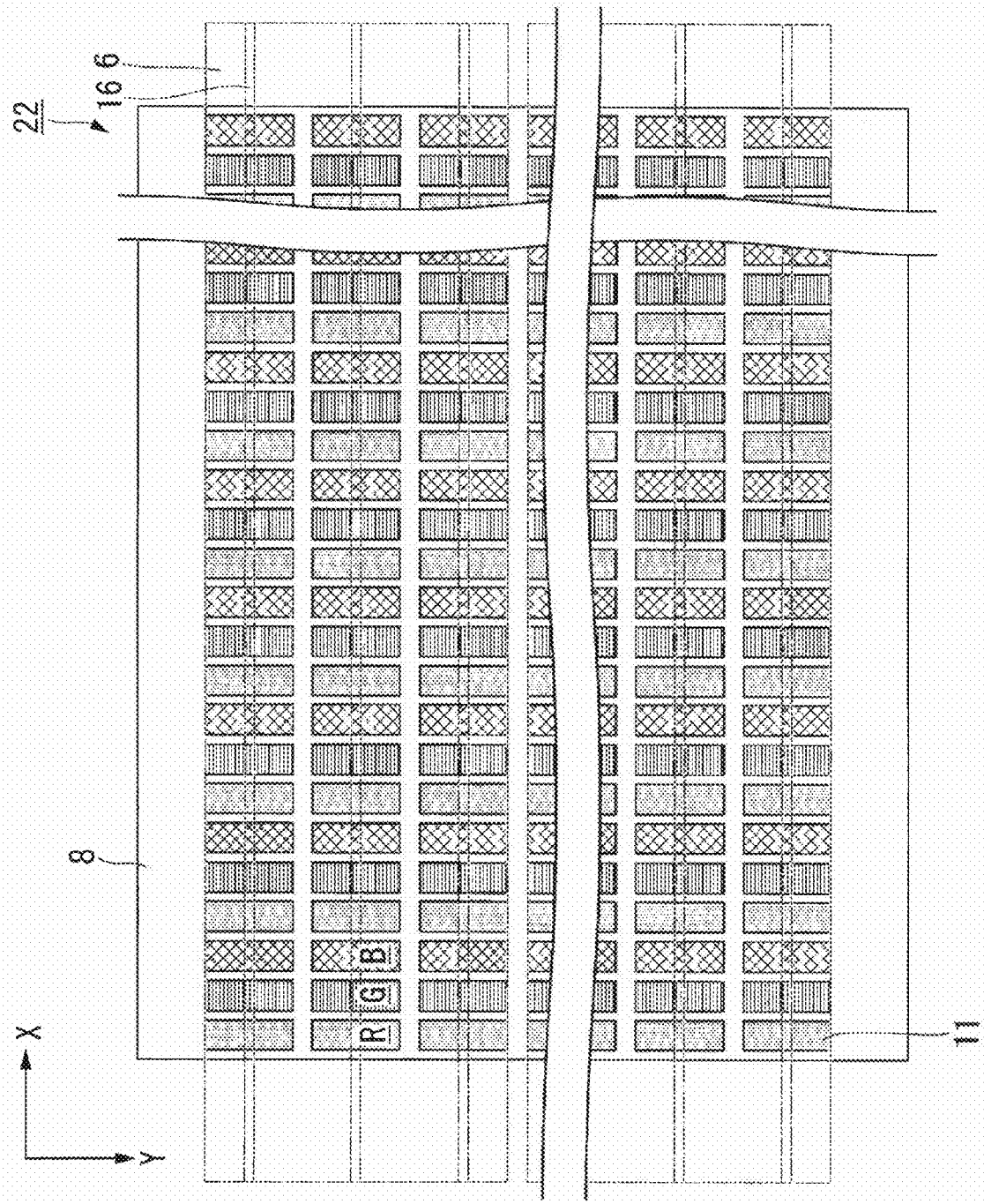
FIG. 12 is a planar view showing a display device substrate according to the third embodiment of the present invention.

In FIG. 12, a planar view is shown in which the display device substrate 22 is viewed from an opposite surface of FIG. 9 which is a transparent electrode 6 side. In FIG. 12, illustration of FIG. 12 is omitted. The transparent electrode 6 can be provided with an auxiliary conductor 16 in order to lower the resistance value of the transparent electrode 6. The resistivity of the auxiliary conductor 16 is smaller than the resistivity of the transparent electrode 6. The auxiliary conductor 16 can be formed with a metal having alkali tolerance or a metal alloy. The auxiliary conductor 16 can be used if there is no process wherein alkali is used in the post-processes of the forming the auxiliary conductor 16. If there is a process that uses alkali in the post processing, copper alloy can be used instead of aluminum alloy.

The auxiliary conductor 16 may preferably be arranged to overlap with other constituents, preventing a decrease of the opening ratio.

Figure 13:
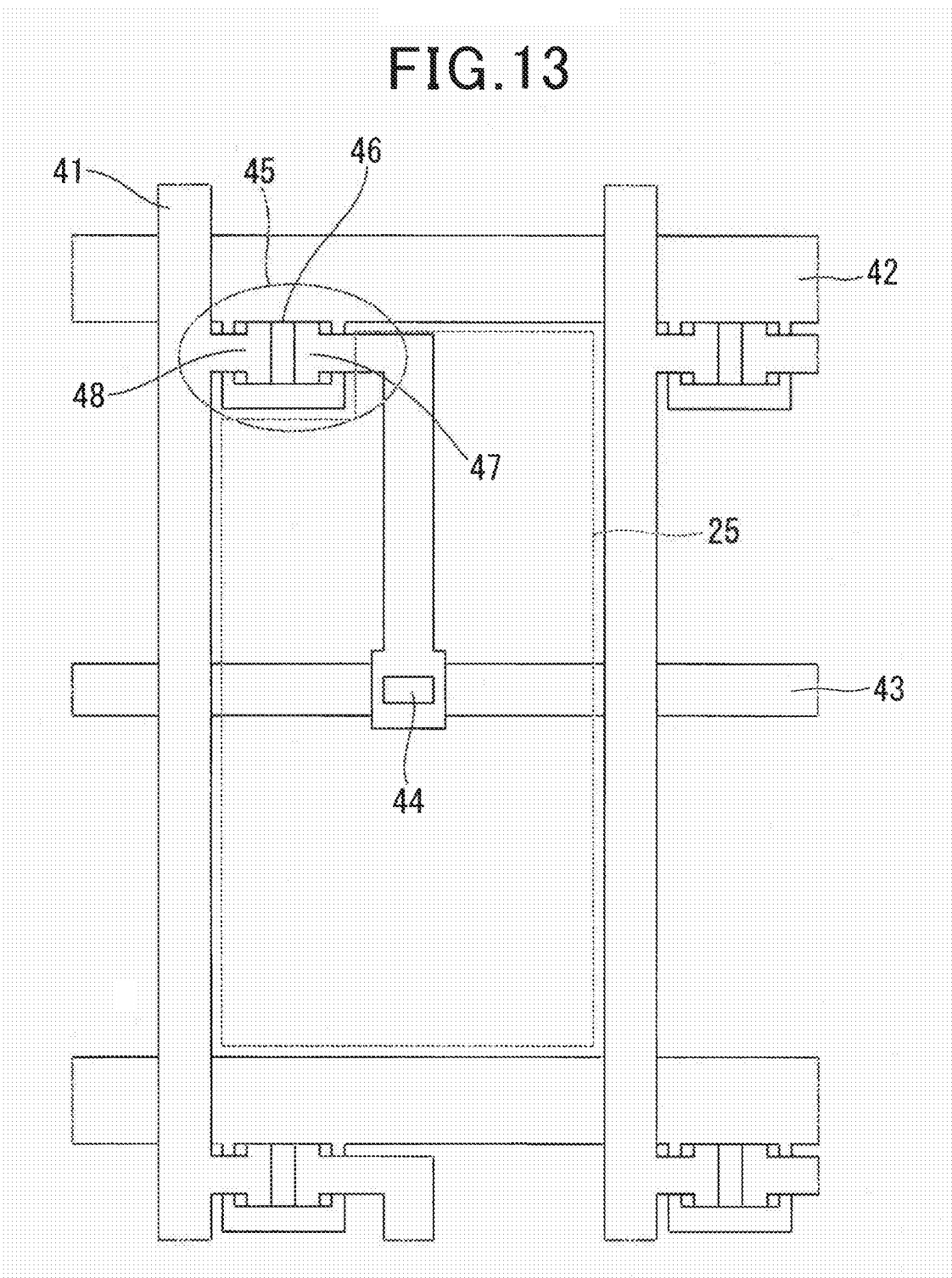
FIG. 13 is a diagram showing a suitable forming position for an auxiliary conductor of a display device substrate according to the third embodiment of the present invention.

FIG. 13 is a planar view showing a pixel including a TFT 45 (thin film transistor), a source wiring 41 (signal line), a gate wiring 42 (scanning line) and an auxiliary capacitance wiring 43 which are formed on the array substrate 23. This TFT 45 is provided with metal wirings such as the source wiring 41, the gate wiring 42 and the auxiliary capacitance wiring 43, a source electrode 48, a drain electrode 47 and a channel layer 46 which is oxide semiconductor 46. As a structure of the metal wiring, a two layered configuration having titanium and copper laminated on the titanium is used. The drain electrode 47 is extended from the channel layer 46 to a pixel center, and electrically connected to the pixel electrode 24 which is a transparent electrode via the contact hole 44. The source electrode 48 is connected to the source wiring 41. The drain electrode and the source electrode 48 are provided to sandwich the channel layer 46. The auxiliary capacitance is formed between the pixel electrode 25 and the auxiliary capacitance wiring 43. When the display device substrate 22 is applied to the display device, for example, the auxiliary conductor 16 is formed at the same position as the auxiliary capacitance wiring 32 in planar view as shown in FIG. 13, whereby unnecessary decrease of the aperture ratio can be avoided. The source wiring 41 and the gate wiring 42 can be formed with a two layered configuration in which copper is laminated on titanium or copper is laminated on molybdenum, or a three layered configuration in which titanium alloy or copper alloy is further laminated on this copper. The auxiliary capacitance wiring 43 can be formed at the same layer as the gate wiring 42 and the same material as the gate wiring 42.

Figure 14:
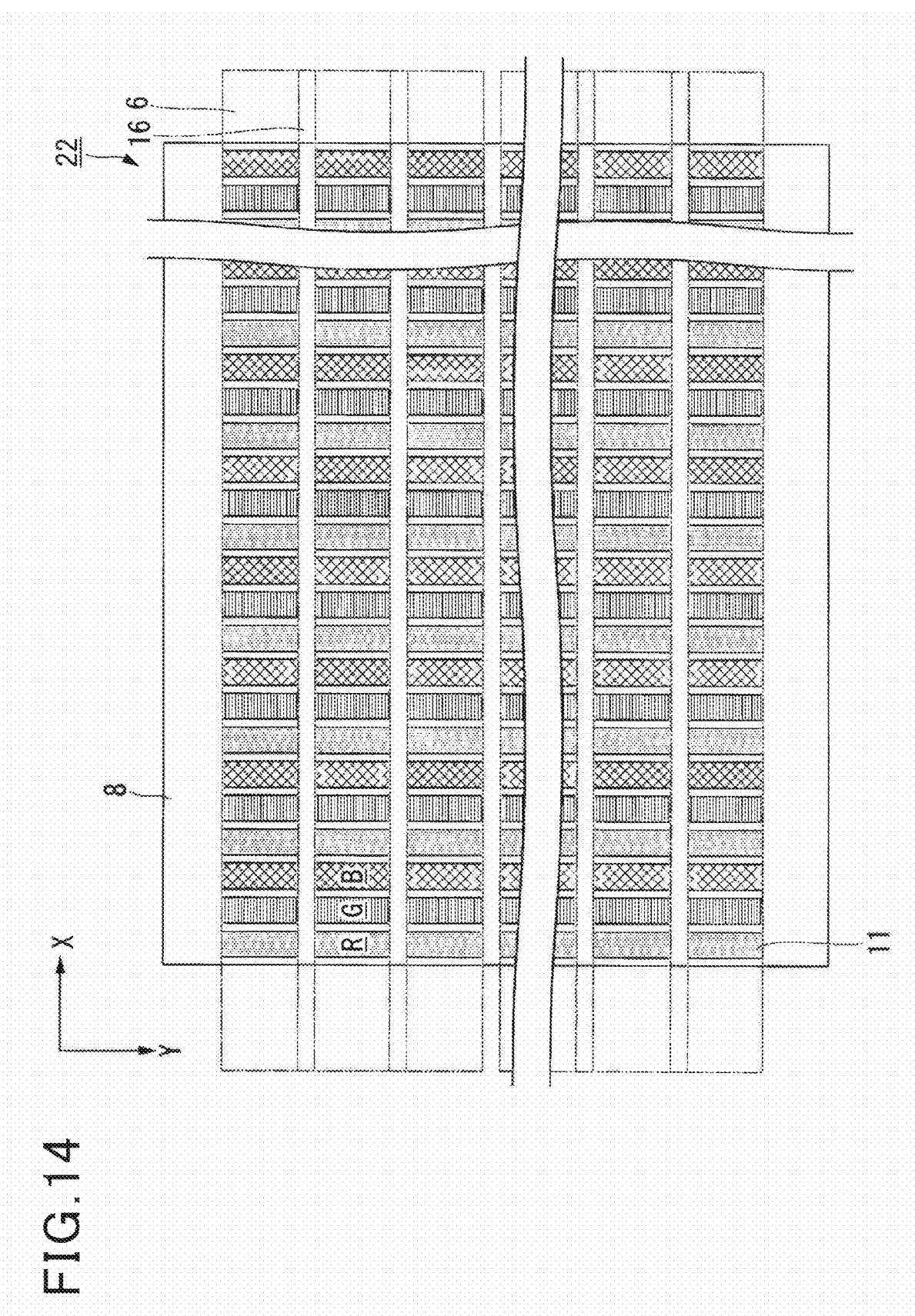
FIG. 14 is a diagram showing a suitable forming position for an auxiliary conductor of a display device substrate according to the third embodiment of the present invention.

FIG. 14 shows a modification of the display device substrate according to the present invention. As shown in FIG. 14, the auxiliary conductor 16 may be formed aligned with a position where the black matrix 8 is formed and the line width thereof, thereby being overlapped with the black matrix 8. In this case, the positions of the patterns between the auxiliary conductor 16 and the black matrix 8 are aligned, whereby excessive decrease of the aperture ratio can be avoided.

(Black Matrix)

As shown in FIG. 8, the black matrix 8 is provided on the first transparent resin layer 5 via the transparent electrode 6. The black matrix 8 is overlapped with a pattern of the low reflectance electrode 4 in planar view. A line width of the black matrix 8 located between the pixel openings 11 can be set as the same width as the low reflectance electrode 4. For the black colorant or a resin used for the black matrix 8, the same material as the light absorption resin layers 1 and 3 according to the first embodiment can be used. The black coating liquid used in the first embodiment may be used for the black matrix 8.

When the display device substrate 22 according to the present embodiment is applied to a liquid crystal display device, a plurality of types of organic pigments may preferably be used for the black colorant used for the black matrix 8, in order not to disturb the equipotential line of the drive voltage applied between the pixel electrode and the common electrode. According the configuration in which the black matrix having high relative dielectric constant as a black colorant is provided near the liquid crystal layer 24, the black matrix disturbs the equipotential line and may cause a light leak. In a case where a plurality of types of organic pigments are used as a black colorant, comparing with a carbon, the relative dielectric constant ranges from 1/5 to 1/3 and then, the light leakage can be suppressed.

(Manufacturing Method of the Display Device Substrate)

Figure 15:
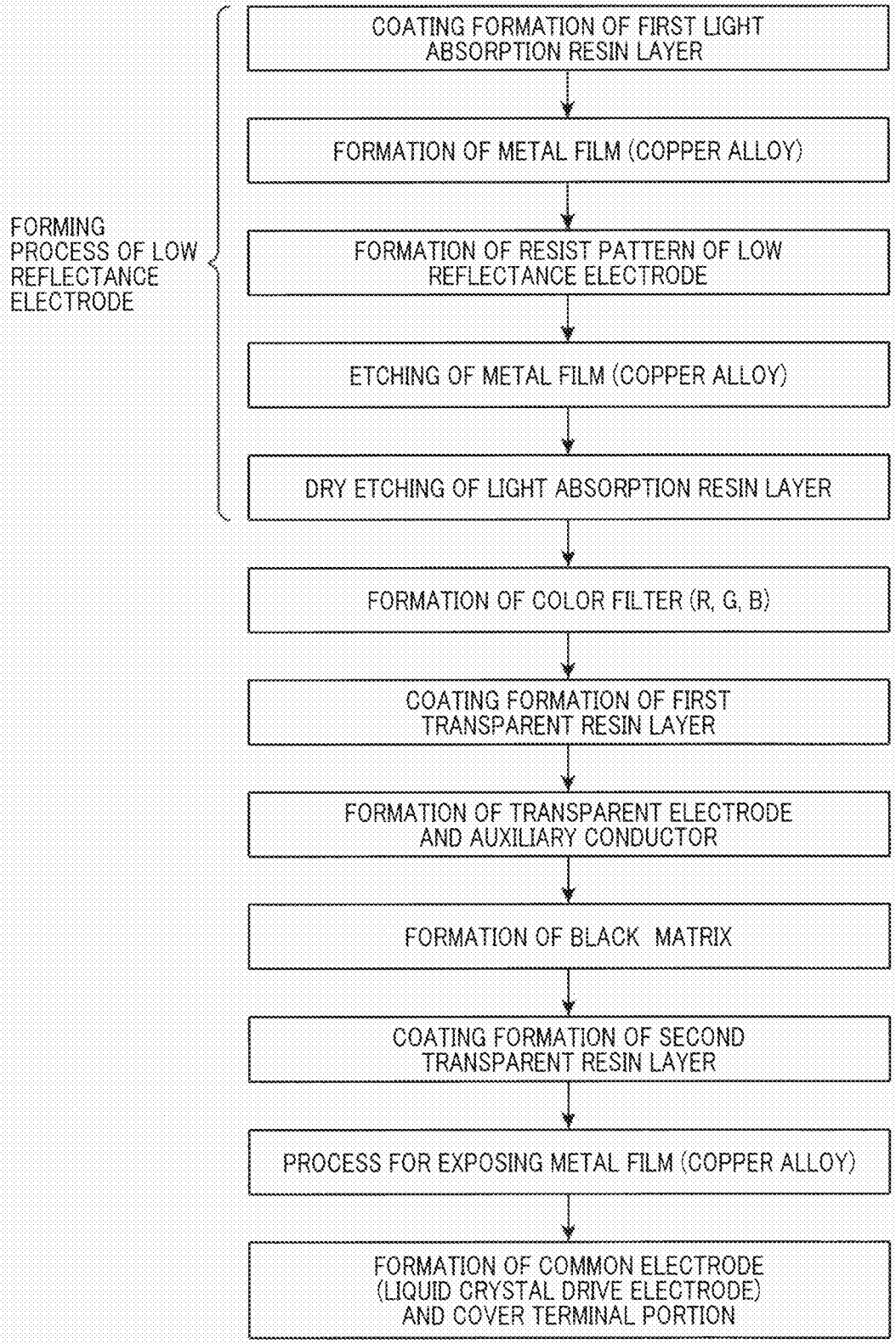
FIG. 15 is a flow chart showing a manufacturing method of a display device substrate according to the third embodiment of the present invention.

A manufacturing method of the display device substrate according to the third embodiment is shown in FIG. 15. The differences from the first embodiment are that, for example, the low reflectance electrode 4 does not form the second light absorption resin layer and the color filters (R, G, B) are newly inserted between the low reflectance electrode 4 and the first transparent resin layer 5.

Figure 16:
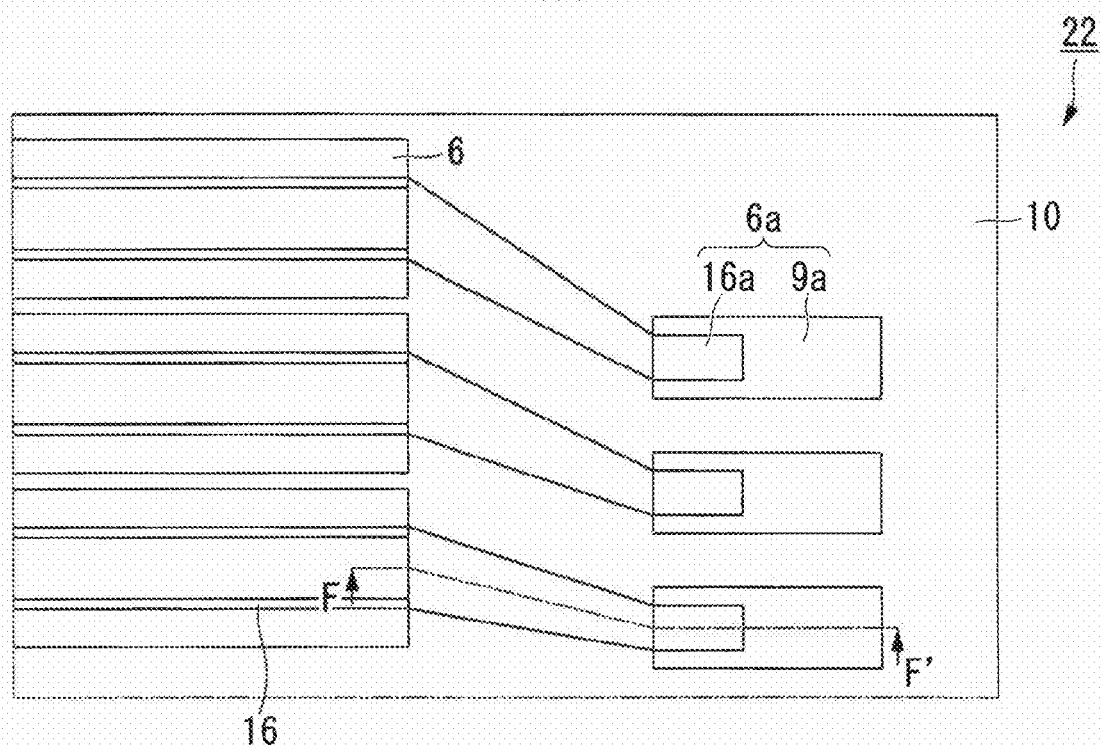
FIG. 16 is an enlarged planar view of a major portion of a display device substrate showing a manufacturing method of a display device substrate according to the third embodiment of the present invention.
Figure 17:
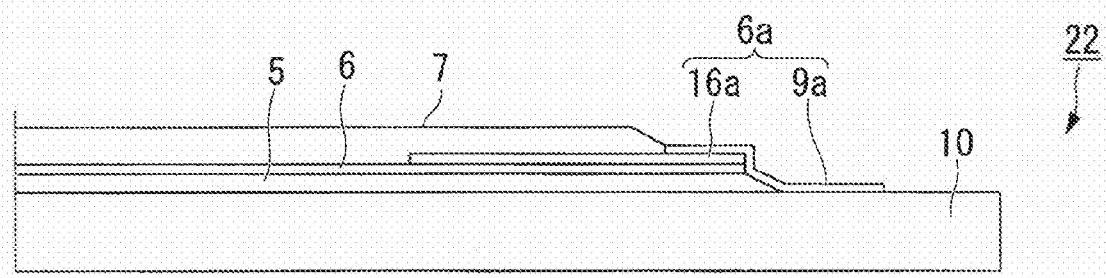
FIG. 17 is an arrow view showing a cross section taken along arrows F-F' as shown in FIG. 16.

According to the present embodiment, a terminal portion 6a of the transparent electrode 6 is formed as shown in FIG. 16 and FIG. 17. The terminal portion 6a is provided with a base terminal 16a where the auxiliary conductor 16 is extended to the region D and a transparent conductive film (cover terminal) 9a is overlapped on the base terminal 16a. The transparent conductive film 9a and the common electrode are formed at the same time and with the same material. The transparent conductive film 9a may preferably be directly attached to the transparent substrate 10. As described above, when the pattern width of the transparent conductive film 9a is wide, since the mounting can readily be made, the transparent resin layers 5 and 7 or the like may be provided as an under layer of the transparent conductive film 9a.

(Effects of Low Reflectance Electrode)

Figure 18:
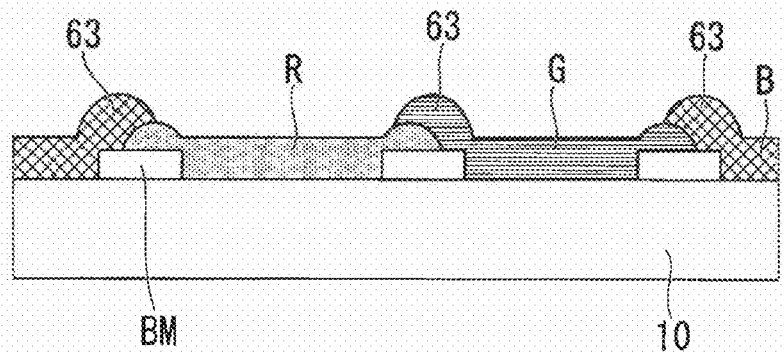
FIG. 18 is a cross sectional view showing an effect of the display device substrate according to the third embodiment of the present invention.

The low reflectance electrode 4 is disposed at almost the same position of the black matrix BM of the well-known color filters formed on the transparent substrate 10 as shown in FIG. 18. Since the well-known black matrix BM is required to have high optical density, the black matrix BM is formed, and is likely to have film thickness approximately 1 to 1.5 Here, as shown in FIG. 18, a protrusion 63 having a height around 1 μm is formed at a portion which overlaps the black matrix BM among the red pixel R, the green pixel G and the blue pixel B which are formed on the transparent substrate 10. The protrusion 63 may cause an alignment failure of liquid crystal when the color filters as shown in FIG. 18 are applied to the liquid crystal display device, thereby significantly decreasing the display quality.

In this regards, the low reflectance electrode 4 according to the present embodiment includes the metal film 2. Hence, sufficient light shielding properties can be obtained, reducing the film thickness. Accordingly, in a case where the red pixel R, the green pixel G and the blue pixel B are formed on the low reflectance electrode 4, protrusions which may influence the display quality can be suppressed from occurring. For the low reflectance electrode 4 according to the present invention, the reflectance of the visible light can be suppressed, to be equal to or less than 0.9%, and the transmitted light emitted from the backlight unit can be shielded completely, thereby significantly improving the visibility.

(Fourth Embodiment)

Figure 19:
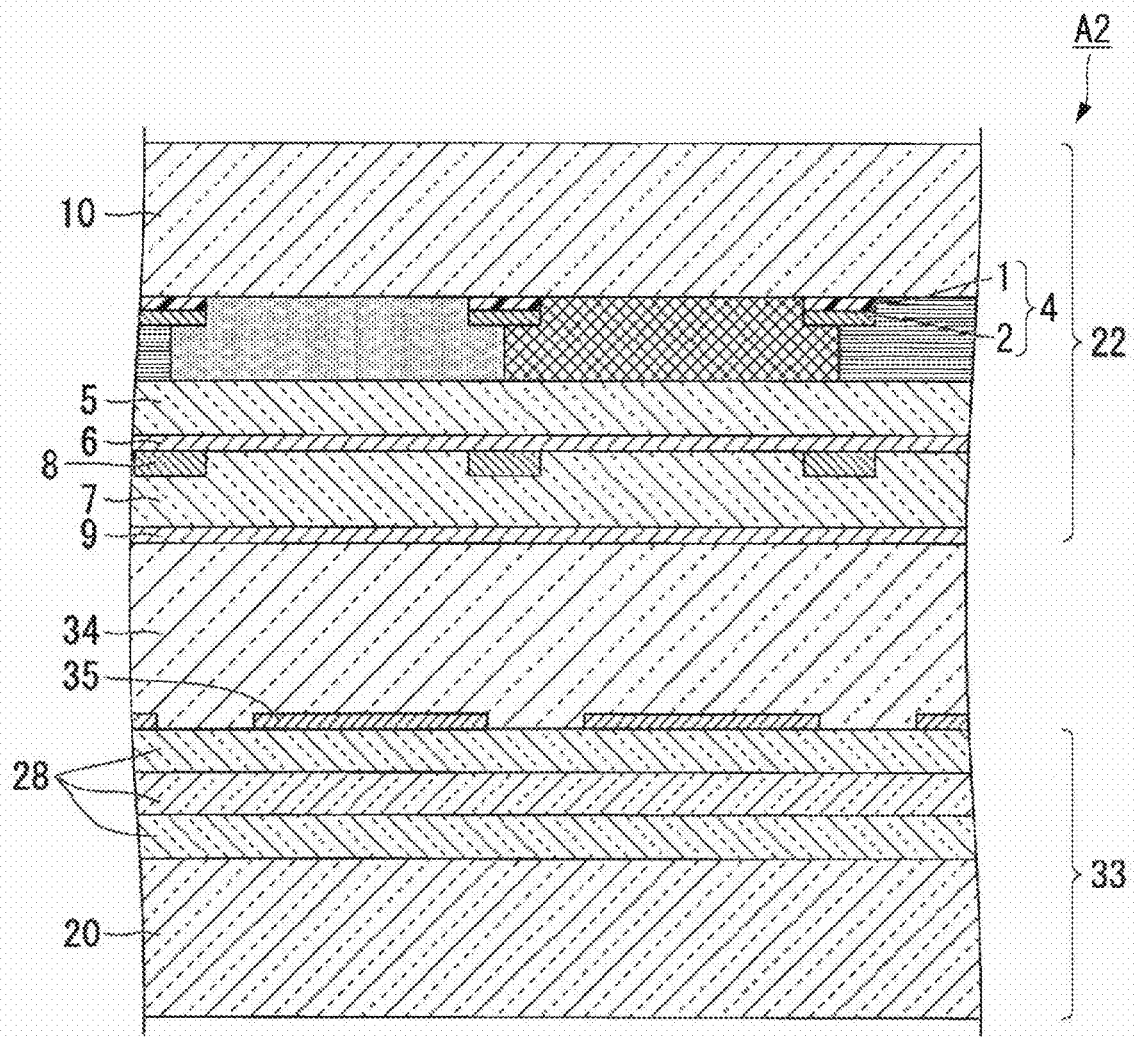
FIG. 19 is a cross sectional view showing a display device according to the fourth embodiment of the present invention.

The fourth embodiment is an example in which the display device substrate according to the third embodiment is applied to the liquid crystal display device. FIG. 19 is a partial cross sectional view of an application example of the liquid crystal display device.

In the display unit A2, the liquid crystal layer 34 has an initial vertical alignment and voltage is applied between the pixel electrode 35 and the common electrode 9, thereby performing the display operation. In FIG. 19, the illustration of an alignment film, a polarizing plate, an active element and a backlight unit or the like are omitted. The backlight unit is located under the transparent substrate 20 of the array substrate 33

(Effects of Black Matrix)

With reference to FIG. 20, hereinafter will be described the problems of conventional display device 100 in which the black matrix BM having a black colorant constituted of a plurality of types of organic pigments is apart from the liquid crystal layer 34. For example, according to a high definition liquid crystal display device 100 having pixels such as 200 ppi (pixel per inch) or 300 ppi, the pixel size is small such that the light 52 being leaked from a portion 51 having alignment failure located between pixels adversely affects the liquid crystal display.

Here, similar to a display device A2 of the present embodiment as shown in FIG. 21, the black matrix 8 formed with a black colorant constituted of a plurality of types of organic pigments is provided near the liquid crystal layer 34, whereby light leakage can be suppressed. Moreover, when the black matrix 8 is formed with a black colorant using a plurality of types of organic pigments, a low density of carbon is required compared to the well-known black matrix BM. Since the relative dielectric constant of the black matrix 8 is small, the distribution of the equipotential lines of the drive voltage is unlikely to be disturbed even when the black matrix is located near the liquid crystal layer 34.

In FIG. 20 and FIG. 21, illustration of the low reflectance electrode, the transparent electrode, the color filters, the alignment film, the polarizer plate or the like are omitted. The liquid crystal of the liquid crystal display device as shown in FIG. 20 and FIG. 21 may be liquid crystal with a FFS method.

(Fifth Embodiment)

Since the fifth embodiment is similar to the third embodiment except the configuration of the metal film 2 which is a configuration of the low reflectance electrode 4, FIGS. 8 to 14 are referenced. However, redundant explanation is omitted and the metal film 2 which differs from the third embodiment only is described. The metal film 2 as shown in FIG. 8 is formed in which a copper alloy containing oxygen having a film thickness of 0.015 μm and a copper alloy substantially containing no oxygen having a film thickness of 0.18 μm are laminated to form a two layered copper alloy film, and further a copper alloy film of copper and indium having a film thickness of 0.015 μm is laminated thereon, to have total film thickness of 0.21 μm. The meaning of substantially containing no oxygen is, when film-forming the copper alloy film, no oxygen gas is introduced.

For the two layered copper alloy film, copper alloy containing 0.5 at % of magnesium, 0.5 at % of aluminum (remnant is copper) was employed. For the copper alloy film of copper and indium, a copper alloy containing 78 at % of copper and 22 at % of indium was employed. It should be noted that a small amount of inevitable impurities is contained in these copper alloys. An amount of addition of indium to the copper alloy may be 0.5% to 40 at %. The indium has a low melting point. A copper alloy of which the content of indium exceeds 50 at % has a concern of insufficient heat resistance properties.

For a metal film 2 provided with a thin film of copper alloy having rich-indium such as 22 at % of indium, indium oxide is formed due to a heat-treatment process after the film formation and aging before forming a copper oxide, so that a formation of the copper oxide is suppressed. When the copper oxide is formed in small amount, an electrical connection at the cover terminal portion with the transparent conductive film can readily be made. As a result, reliability of the manufacturing processes and mounting can be improved. Also, a reflective color on a surface of the thin film made of indium-rich copper alloy becomes whitish color so that a red coloration due to single copper can be avoided. To make the reflective color neutral, it is not limited to controlling an added amount of indium in the copper alloy. However, with the exemplified alloying elements as described above, a ratio of addition can be adjusted. The techniques concerning these copper alloy disclosed in the present invention can be applied to the metal wiring in the array substrate 23.

(Functions Capable of being Provided with Low Reflectance Electrode)

For example, the low reflectance electrode according to the above-described respective embodiments is able to serve as a so-called detection electrode during touch sensing operation. The transparent electrode is able to serve as a drive electrode (scanning electrode) that applies voltage having constant frequency to the low reflectance electrode (it should be noted that the voltage applied to the drive electrode may be an inversion drive method). Here, the low reflectance electrode has low resistance, and the transparent electrode can have low resistance when including, for example, an auxiliary conductor. Hence, a change in the electrostatic capacitance produced during a touch sensing operation can be detected accurately. Additionally, the low reflectance electrode which is excellent conductor can be provided as a detection electrode, being in a matrix shape with a thin line width. With a fringe effect of a pattern of the low reflectance electrode provided on the transparent electrode, having a thin line width, an electrostatic capacitance in the vicinity of the pattern edge (fringe capacitance) is increased so that the electrostatic capacitance can be increased. In other words, difference between electrostatic capacitances produced depending on whether or not a touch of the pointer such as a finger is present, can be increased, improving the S/N ratio so that the detection accuracy can be higher. Further, the low reflectance electrode serves as, for example, a black matrix having low reflectance when viewing from the display surface of the display device, thereby improving visibility. Furthermore, the copper alloy film used for a configuration of the low reflectance electrode completely cuts out visible light so that light leakage from the backlight unit can be avoided. Also, since the low reflectance electrode of the present invention processes the pattern of the first light absorption resin layer by dry etching using the metal film or the second light absorption resin layer as a matrix (mask), there is a feature that the low reflectance electrode has the same line width as the first light absorption resin layer and the same line width and the same shape as the first light absorption resin layer. Accordingly, the aperture ratio of the pixels is not lowered.

The technical scope of the present invention is not limited to the above-described embodiments, however, various modification can be applied without departing from the scope of the present invention. Also, the above-described modifications can be appropriately combined. For example, in the display device substrate 12 as shown in FIG. 1, the low reflectance electrode 4 is constituted of three layers including the first light absorption resin layer 1, the metal film 2 and the second light absorption resin layer 3. According to the present invention, it is not limited to the low reflectance electrode 4 having three layered configuration. However, as shown in FIG. 8 and FIG. 19, a configuration in which a low reflectance electrode 4 is constituted of two layers including the first light absorption resin layer 1 and the metal film 2 may be applied.

According to Patent Literatures PTL 1 to PTL 4, the following problems arise.

In PTL 1, as disclosed in paragraphs 0018 and 0019, two electrode groups are disclosed in which a coordinate space can be received by using electrostatic coupling with a metal such as Al (aluminum), Cr (chromium).

However, a technique according to PTL 1 has many disadvantages. In paragraph 0019, it is disclosed that two pairs of light shielding electrodes serve as a black matrix. The conductor having light shielding properties is disclosed as a metal such as Al or Cr. However, since these metals have high reflectance, the reflected light stands out in a bright indoor situation or outside under sunlight so that the display quality is significantly decreased. Further, in PTL 1, the positional relationship in a thickness direction of the display device is not disclosed for a black layer pattern using a black colorant applied to many of display devices to obtain contrast for the display device, and for the above-described two pairs of electrodes. Also, PTL 1 does not sufficiently disclose a color display including transmission and reflection.

Moreover, Al (aluminum) is not alkali tolerance so that it is hard to obtain compatibility with, for example, a photolithography process for red pixels, green pixels and blue pixels. Specifically, according to a regular color filter process in which a colored pattern such as red pixels is alkali-developed by using colored photosensitive resin, because Al is dissolved, aluminum cannot be used for the color filter process. Regarding Cr, there is a concern about environmental pollution with Cr ion when wet etching is applied for pattern formation. Also, there is risk of danger from halogen gas when using a dry etching process.

PTL 2 proposes a color filter having a touch panel function as disclosed in claims 1 and 3 and as shown in FIG. 2, in which a conductive light shielding portion is disposed in a color filter layer and a first electrode and a second electrode are provided between the color filter layer and a base material. According to a technique of PTL 2, as disclosed in paragraph 0063, a conductive light shielding portion is used as a light shielding portion having a two layer configuration including a reflection prevention portion which is chromium oxide used as a black matrix and a body portion.

However, chromium oxide and chromium are not preferably used for production because environmental pollution is expected from the wet etching process for pattern formation as described above. As for the two layer configuration including chromium oxide and chromium, the reflectance is high, around 7% even in a configuration having low reflectance of light and also the conductivity is not satisfactory. Moreover, as disclosed in claim 3 and paragraphs 0058 to 0060 in PTL 2, to provide a touch panel function, two layers of electrodes including the first electrode and the second electrode via the first insulation layer are required.

As described above, according to an invention of PTL 2, since the conductive light shielding layer is not optimized, the reflectance is high and the electrode configuration is complicated (has a large number of layers), and also the configuration is not favorable. As disclosed in claim 1 of PTL 2, the conductive light shielding portion is grounded, which is not used for the touch sensing electrode.

PTL 3 has a configuration similar to that of the above-described PTL 2. However, as disclosed in claim 1 and claim 2, the light shielding layer (black matrix) is a conductor and electrically connected to a counter electrode located at a liquid crystal layer side via a contact hole. The counter electrode is a common electrode used for driving the liquid crystal. The light shielding layer which is a conductor is electrically connected to the counter electrode, whereby the resistance of the counter electrode becomes low, obtaining an effect of reducing the RC time constant due to the counter electrode, as disclosed in paragraph 0026 of PTL 3.

As a touch panel function, as disclosed in claim 6 and claim 7 of PTL 3, a plurality of first electrodes and a plurality of second electrodes are further provided. In PTL 3, as disclosed in claim 8, the first and second electrodes are bridge-connected with a metal wiring to bridge across a direction where the first electrode and the second electrode are crossed with each other. In PTL 3, a metal wiring is necessary for the bridge-connection and contact holes are required to be formed. Hence, the configuration as disclosed in PTL 3 is very complicated.

As a light shielding layer, in paragraph 0064 of PTL 3, a metal film, a metal compound and a metal silicide are exemplified and a detection electrode used for touch sensing is provided in a layer different from the light shielding layer. It should be noted that a technique for forming the light shielding layer with a low reflectance, e.g., 0.9% or less, is not disclosed in PTL 3.

In claim 1 of PTL 4, a technique is disclosed in which the black matrix is used as a detection electrode. The basic concept of PTL 4 is included in PTL 1. This black matrix is constituted by chrome and chromium oxide as disclosed in paragraph 0019 of PTL 4. The chromium has high electrical resistivity, which is not favorable as a touch sensing electrode. Also, in PTL 4, a technique for forming the black matrix with a low reflectance, e.g., 0.9% or less is not disclosed.

Considering the above-described circumstances, a display device is desired to have the following properties. Specifically, the above-described two pairs of pluralities of electrode groups in the electrostatic capacitance method are required to have low resistance to reduce noise when being touched by a pointer such as fingers. Especially, a plurality of electrode groups are required to be located closely to a pointer such as fingers and the resistance value of the detection electrode is required to be low. The resistance value of the drive electrode (scanning electrode) which orthogonally crosses the detection electrode may preferably be low.

Also, the plurality of electrode groups to be applied to the display device is required to have low reflectance or high transmittance. The requirement of the low reflectance is based on the fact that the display quality is significantly decreased when the reflectance of the plurality of electrode groups is high when bright light from outside such as sunlight is entering the display surface of the display device. For example, in a case where aluminum or chromium is used and at least a pair of electrode group is formed, visibility of the display is lost due to high reflectance to external light.

Also, according to a conventional display device substrate of the above-described PTL 1 to PTL 4, in a case where the substrate is applied to, for example, a liquid crystal display device using an IPS (In-Plane Switching) method as a drive method of liquid crystal, there is still room for improvement of the transmittance of the display device.

The present invention has been achieved in light of the above-described issues. The first object of the present invention is to provide a display device substrate capable of improving the transmittance of the display device and a display device provided with the display device substrate. The second object of the present invention is to provide a display device substrate in which the location of pointer such as fingers is detected accurately, and a low reflectance electrode having low resistance is provided, and to provide a display device thereof.

The display device substrate according to a first aspect of the present invention is provided with a transparent substrate having a display portion formed in an overall rectangular shape in planar view; a low reflectance electrode provided in the display portion, having a plurality of pixel openings and a plurality of partial patterns parallel with respect to a first direction along the transparent substrate and being mutually and electrically isolated; a first transparent resin layer laminated on the low reflectance electrode; a transparent electrode laminated on the first transparent resin layer, having a plurality of partial patterns parallel with respect to a second direction perpendicular to the first direction and being along the transparent substrate; and a second transparent resin layer laminated on the partial patterns of the transparent electrode. The display device according to a second aspect of the present invention is provided with the above-described display device substrate.

For the low reflectance electrode according to the present invention, a reflectance produced at a boundary surface between the low reflectance electrode and the transparent substrate may be set to be 1% or less or 0.9% or less within a range of light wavelength from 400 nm to 700 nm. Generally, according to the light shielding film containing high density carbon as a black colorant, for example, the reflectance produced at a boundary surface between the transparent substrate and the reflectance electrode is approximately 2% when the optical density is 4 or more with a film thickness of 1.5 μm.

Here, in the above-described display device substrate, the low reflectance electrode may be constituted of a first light absorption resin layer containing a black colorant and a metal film having alkali tolerance which are laminated on the display portion in this order. According to the low reflectance electrode of the present invention, for example, a transmitted light which is a light emitted from the back light unit located at the back surface of the display device can be almost completely shielded with a metal film included in the configuration of the low reflectance electrode. Therefore, the low reflectance electrode where both low reflectance properties and light shielding properties are provided and visibility is significantly improved can be provided.

According to the above-described display device substrate, the low reflectance electrode may include a second light absorption resin layer containing a black colorant that is further laminated on the metal film.

According to the above-described display device substrate, an optical density of the first light absorption resin layer measured by a transmittance measurement may range from 0.4 to 1.8 per 1 μm film thickness, a film thickness of the first light absorption resin layer may range from 0.1 μm to 0.7 μm and a film thickness of the low reflectance electrode may be equal to or less than 1 μm.

According to the above-described display device substrate, a metal that constitutes the metal film may be a copper alloy.

According to the above-described display device substrate, an alloying element contained in the copper alloy may be one or more element selected from magnesium, calcium, titanium, molybdenum, indium, tin, zinc, aluminum, beryllium and nickel. Also, according to the above-described display device substrate, the black colorant may be carbon.

According to the above-described display device substrate, a terminal portion may be provided in an outer periphery of the display portion, the terminal portion being electrically connected to the low reflectance electrode; and the terminal portion may be provided with a base terminal in which the partial pattern of the low reflectance electrode is extended and the metal film is exposed, and a cover terminal overlapped on the base terminal.

According to the above-described display device substrate, an auxiliary conductor may be provided on the partial pattern of the transparent electrode, the auxiliary conductor having a resistivity smaller than a resistivity of the transparent electrode.

According to the above-described display device substrate, any one of red pixels formed with a red layer, green pixels formed with a green layer and blue pixels formed with a blue layer may be provided on the pixel openings; and the red pixels, the green pixels and the blue pixels may be provided adjacently between the transparent substrate and the first transparent resin layer in planar view.

According to the above-described display device substrate, a black matrix may be provided on the first transparent resin layer via the partial pattern, the black matrix being overlapped with the partial pattern of the low reflectance electrode in planar view.

According to the above-described display device substrate, the black matrix may be a black layer having light shielding properties of which a colorant is an organic pigment.

According to the above-described display device substrate, a common electrode that is a transparent conductive film may be further provided on the second transparent resin layer.

According to the above-described display device substrate, a terminal portion may be provided in an outer periphery of the display portion, the terminal portion being electrically connected to the low reflectance electrode; and a cover terminal may be provided on the terminal portion, the cover terminal being formed with the same material used for forming the transparent electrode or the common electrode and being electrically isolated from the transparent electrode or the common electrode.

According to the above-described display device substrate, an auxiliary conductor made of an aluminum alloy may be provided on the partial pattern of the transparent electrode; a terminal portion may be provided in an outer periphery of the display portion, the terminal portion being electrically connected to the transparent electrode; and a base terminal where the auxiliary conductor is extended and a cover terminal may be provided on the terminal portion, the cover terminal being formed with the same material used for forming the common electrode and being electrically isolated from the common electrode. The auxiliary conductor may be formed with a copper alloy.

According to the above-described display device substrate, a touch sensing function may be provided, in which an electrostatic capacitance that changes in response to a pointer approaching to or contacting a display screen of the display device, is detected as a change in an electrostatic capacitance between the partial pattern of the metal film and the partial pattern of the transparent electrode.

According to the above-described aspects of the present invention, for example, a display device substrate having a touch sensing function and capable of improving the transmittance of the display device, and a display device provided with the display device substrate, can be provided. Further, according to the above-described aspects, for example, a display device substrate can be provided in which location of pointers such as fingers is detected accurately, including low reflectance electrode having small resistance value and low reflectance, and a display device thereof can be provided.

REFERENCE SIGNS LIST

1: first light absorption resin layer
2: metal film
3: second light absorption resin layer
4: low reflectance electrode
5: first transparent resin layer
6: transparent electrode
6a, 61: terminal portion
7: second transparent resin layer
8: black matrix
9, 26: common electrode
9a, 61b: transparent conductive film (cover terminal)
10: transparent substrate
11: pixel opening
12, 22: display device substrate
16: auxiliary conductor
16a, 61a: base terminal
24: liquid crystal layer
25: pixel electrode
28: insulation layer
R: red pixel
G: green pixel
B: blue pixel Obviously, numerous modifications and variations of the present invention are possible in light of the above teachings. It is therefore to be understood that within the scope of the appended claims, the invention may be practiced otherwise than as specifically described herein.

What is claimed is:

1. A display device substrate, comprising:
a transparent substrate having a display portion formed in an overall rectangular shape in a planar view;
an electrode disposed in the display portion and having a plurality of pixel openings, the electrode including a plurality of partial patterns which are electrically isolated from one another and formed in parallel to a first direction along the transparent substrate;
a first transparent resin layer formed on the electrode;
a transparent electrode formed on the first transparent resin layer, and including a plurality of partial patterns which are formed along the transparent substrate and in parallel to a second direction perpendicular to the first direction; and
a second transparent resin layer formed on the partial patterns of the transparent electrode,
wherein the electrode comprises a first light absorption resin layer, a metal film formed on the display portion in an order thereof, and a second light absorption resin layer formed on the metal film, the first light absorption resin layer includes a black colorant, the metal film has alkali tolerance, and the second light absorption resin layer includes a black colorant.

2. The display device substrate according to claim 1, wherein the first light absorption resin layer has an optical density in a range of from 0.4 to 1.8 per 1 μm film thickness, as measured by a transmittance measurement, the first light absorption resin layer has a film thickness in a range of from 0.1 μm to 0.7 μm, and the electrode has a film thickness of 1 μm or less.

3. The display device substrate according to claim 1, wherein the metal film comprises a copper alloy.

4. The display device substrate according to claim 3, wherein the copper alloy comprises at least one selected from the group consisting of magnesium, calcium, titanium, molybdenum, indium, tin, zinc, aluminum, beryllium and nickel.

5. The display device substrate according to claim 1, wherein the black colorant of the first light absorption resin layer is carbon.

6. The display device substrate according to claim 1, wherein the display portion has a terminal portion formed in an outer periphery of the display portion, the terminal portion is electrically connected to the electrode and includes a base terminal and a cover terminal formed on the base terminal, and the base terminal includes an extended portion of the partial patterns of the electrode and has the metal film exposed.

7. The display device substrate according to claim 1, further comprising:
an auxiliary conductor formed on the partial patterns of the transparent electrode,
wherein the auxiliary conductor has a resistivity smaller than a resistivity of the transparent electrode.

8. The display device substrate according to claim 1, wherein red pixels formed by a red layer, green pixels formed by a green layer or blue pixels formed by a blue layer are formed in the pixel openings, and the red pixels, the green pixels or the blue pixels are formed adjacently between the transparent substrate and the first transparent resin layer in a planar view.

9. The display device substrate according to claim 1, further comprising:
a black matrix formed on the first transparent resin layer via the partial patterns such that the black matrix overlaps with the partial patterns of the electrode in a planar view.

10. The display device substrate according to claim 9, wherein the black matrix is a black layer which has a light shielding property and includes a colorant comprising an organic pigment.

11. The display device substrate according to claim 1, further comprising:
a common electrode comprising a transparent conductive film and formed on the second transparent resin layer.

12. The display device substrate according to claim 11, further comprising:
- a terminal portion formed in an outer periphery of the display portion and electrically connected to the electrode; and
- a cover terminal formed on the terminal portion,
- wherein the cover terminal comprises a material same as a material in the transparent electrode or the common electrode, and is electrically isolated from the transparent electrode or the common electrode.

13. The display device substrate according to claim 11, further comprising:
- an auxiliary conductor comprising an aluminum alloy and formed on the partial patterns of the transparent electrode; and
- a terminal portion formed in an outer periphery of the display portion and electrically connected to the transparent electrode,
- wherein the terminal portion includes a base terminal and a cover terminal, the base terminal includes an extended portion of the auxiliary conductor, and the cover terminal comprises a material same as a material in the common electrode and is electrically isolated from the common electrode.

14. A display device, comprising:
- the display device substrate according to claim 1.

15. The display device according to claim 14, which has a touch sensing function and is configured such that an electrostatic capacitance that changes in response to a pointer approaching or contacting to a display screen of the display device is detected as a change in an electrostatic capacitance between the partial patterns of the metal film and the partial patterns of the transparent electrode.

16. The display device substrate according to claim 2, wherein the metal film comprises a copper alloy.

17. The display device substrate according to claim 2, wherein the black colorant of the first light absorption resin layer is carbon.

18. The display device substrate according to claim 2, wherein the display portion has a terminal portion formed in an outer periphery of the display portion, the terminal portion is electrically connected to the electrode and includes a base terminal and a cover terminal formed on the base terminal, and the base terminal includes an extended portion of the partial patterns of the electrode and has the metal firm exposed.

19. A display device substrate, comprising:
- a transparent substrate having a display portion formed in an overall rectangular shape in a planar view;
- an electrode disposed in the display portion and having a plurality of pixel openings, the electrode including a plurality of partial patterns which are electrically isolated from one another and formed in parallel to a first direction along the transparent substrate;
- a first transparent resin layer formed on the electrode;
- a transparent electrode formed on the first transparent resin layer, and including a plurality of partial patterns which are formed along the transparent substrate and in parallel to a second direction perpendicular to the first direction;
- a second transparent resin layer formed on the partial patterns of the transparent electrode; and
- an auxiliary conductor formed on the partial patterns of the transparent electrode and having a resistivity smaller than a resistivity of the transparent electrode.

20. A display device substrate, comprising:
- a transparent substrate having a display portion formed in an overall rectangular shape in a planar view;
- an electrode disposed in the display portion and having a plurality of pixel openings, the electrode including a plurality of partial patterns which are electrically isolated from one another and formed in parallel to a first direction along the transparent substrate;
- a first transparent resin layer formed on the electrode;
- a transparent electrode formed on the first transparent resin layer, and including a plurality of partial patterns which are formed along the transparent substrate and in parallel to a second direction perpendicular to the first direction;
- a second transparent resin layer formed on the partial patterns of the transparent electrode;
- a common electrode comprising a transparent conductive film and formed on the second transparent resin layer;
- an auxiliary conductor comprising an aluminum alloy and formed on the partial patterns of the transparent electrode; and
- a terminal portion formed in an outer periphery of the display portion and electrically connected to the transparent electrode,
- wherein the terminal portion includes a base terminal and a cover terminal, the base terminal includes an extended portion of the auxiliary conductor, and the cover terminal comprises a material same as a material in the common electrode and is electrically isolated from the common electrode.

\* \* \* \* \*